(12) United States Patent
Choi et al.

(10) Patent No.: US 9,324,746 B2
(45) Date of Patent: Apr. 26, 2016

(54) PIXEL CIRCUIT FOR GLOBAL SHUTTER OF SUBSTRATE STACKED IMAGE SENSOR

(71) Applicant: SiliconFile Technologies Inc., Seongnam-si, Gyeonggi-do (KR)

(72) Inventors: Jin Eun Choi, Seongnam-si (KR); Jae Won Uhm, Seongnam-si (KR); Seung Hoon Sa, Seongnam-si (KR)

(73) Assignee: SILICONFILE TECHNOLOGIES INC., Gyeonggi-do (KR)

( * ) Notice: Subject to any disclaimer, the term of this patent is extended or adjusted under 35 U.S.C. 154(b) by 0 days.

(21) Appl. No.: 14/497,442

(22) Filed: Sep. 26, 2014

(65) Prior Publication Data

US 2015/0084098 A1   Mar. 26, 2015

(30) Foreign Application Priority Data

Sep. 26, 2013 (KR) .......................... 10-2013-0114388
Nov. 8, 2013 (KR) .......................... 10-2013-0135804

(51) Int. Cl.
*H01L 27/148* (2006.01)
*H01L 29/768* (2006.01)
*H01L 27/146* (2006.01)

(52) U.S. Cl.
CPC ...... *H01L 27/14612* (2013.01); *H01L 27/1464* (2013.01); *H01L 27/14634* (2013.01); *H01L 27/14656* (2013.01); *H01L 27/14621* (2013.01)

(58) Field of Classification Search
CPC .................. H01L 27/14609; H01L 27/14643; H01L 27/14647; H01L 27/14831
USPC ........................................................ 257/229
See application file for complete search history.

(56) References Cited

U.S. PATENT DOCUMENTS

2014/0327052 A1* 11/2014 Tatani ................ H01L 27/1463
257/229

FOREIGN PATENT DOCUMENTS

| KR | 10-2005-0029230 | 3/2005 |
| KR | 10-2007-0113607 | 11/2007 |
| KR | 10-2008-0019652 | 3/2008 |
| KR | 10-2008-0041912 | 5/2008 |
| KR | 10-0835892 | 6/2008 |
| KR | 10-1154389 | 6/2012 |
| KR | 10-2013-0062188 | 6/2013 |
| KR | 10-2013-0085124 | 7/2013 |

* cited by examiner

*Primary Examiner* — Hoai V Pham
(74) *Attorney, Agent, or Firm* — IP & T Group LLP

(57) ABSTRACT

A pixel circuit for a global shutter of a substrate-stacked image sensor may include a semiconductor chip including: a photodiode configured to output electric charges generated through a light sensing operation; and a reset node configured to receive a reset voltage from a reset voltage node and reset the photodiode. The semiconductor chip may have a structure in which the semiconductor chip is stacked over another semiconductor chip.

19 Claims, 27 Drawing Sheets

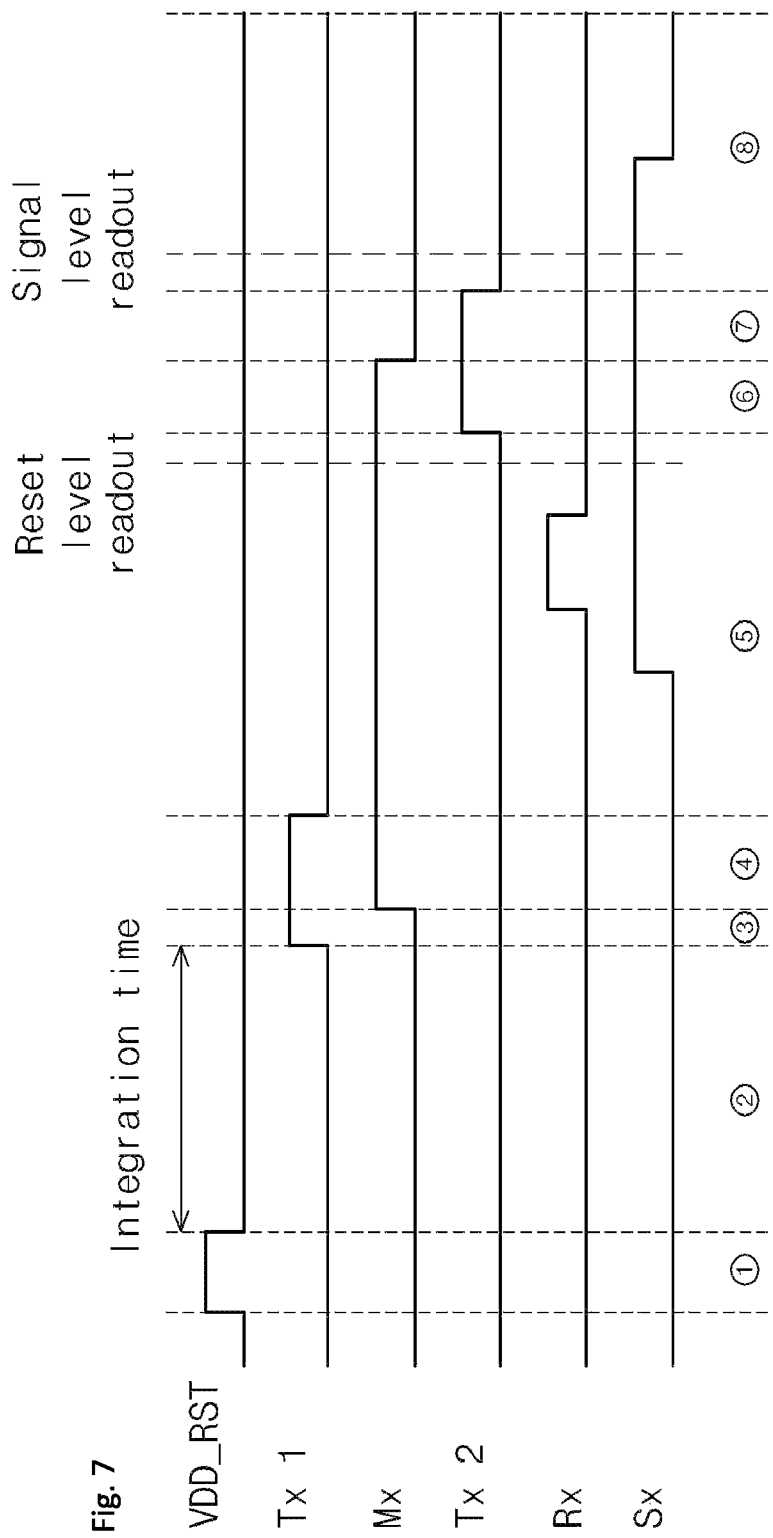

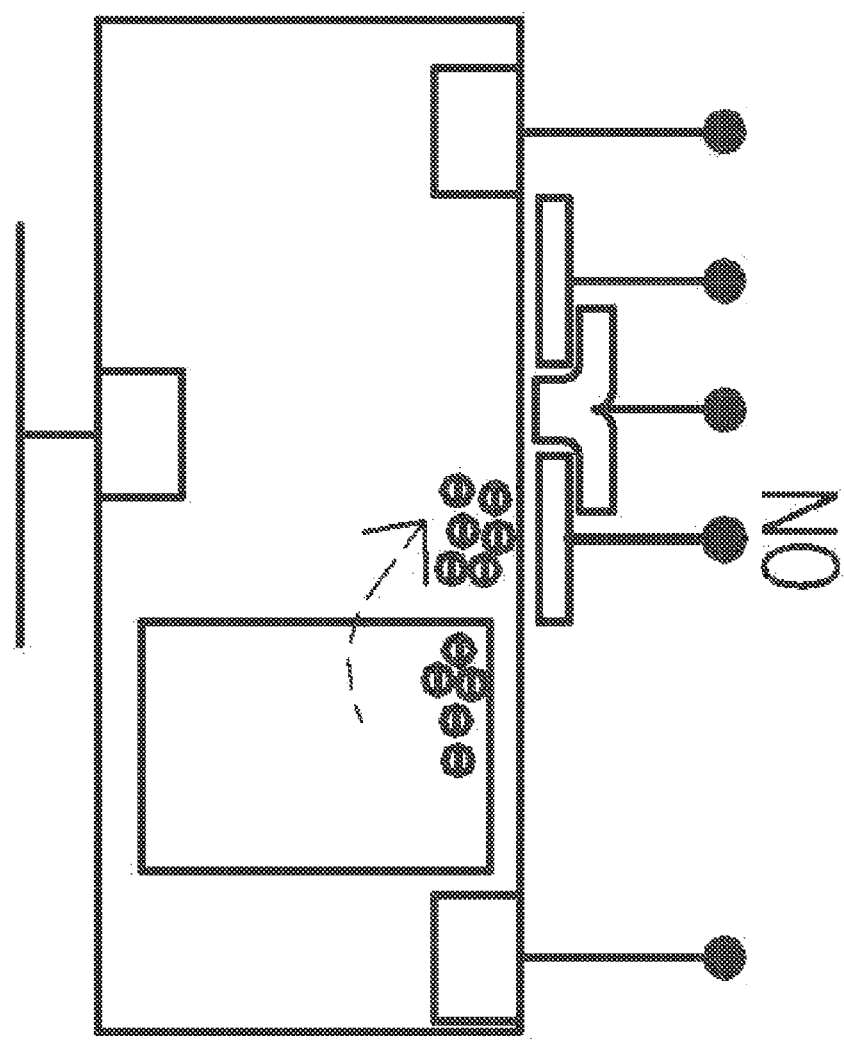

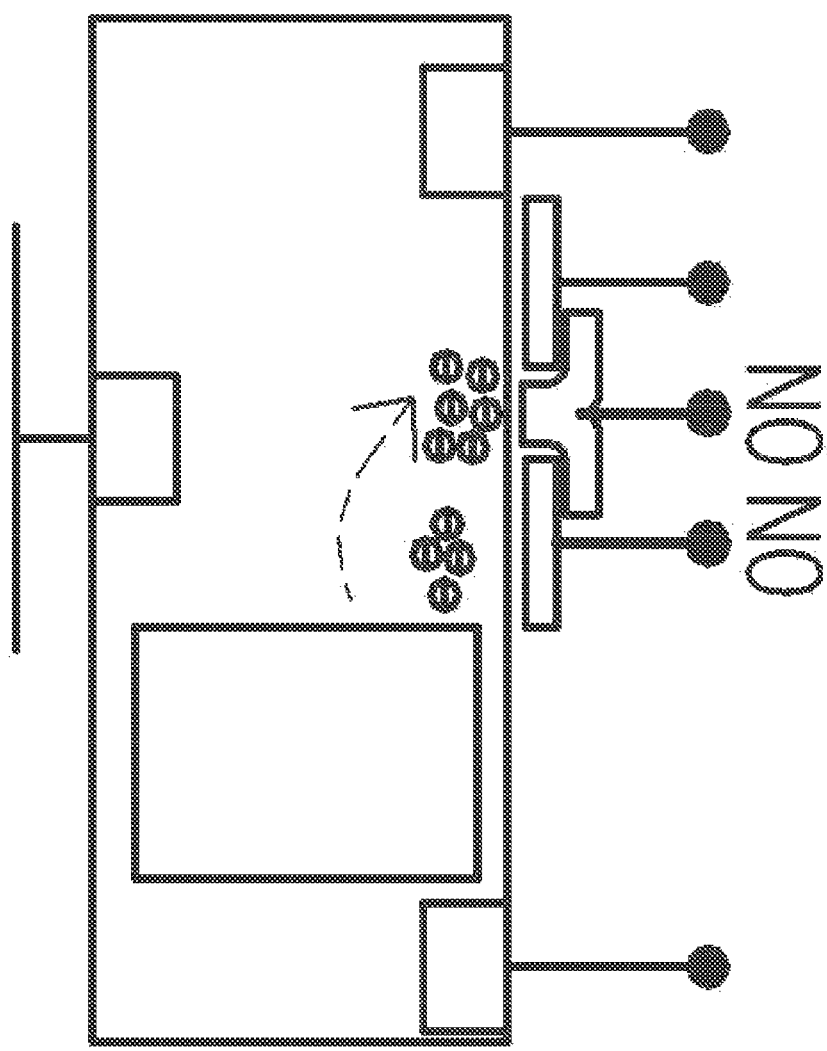

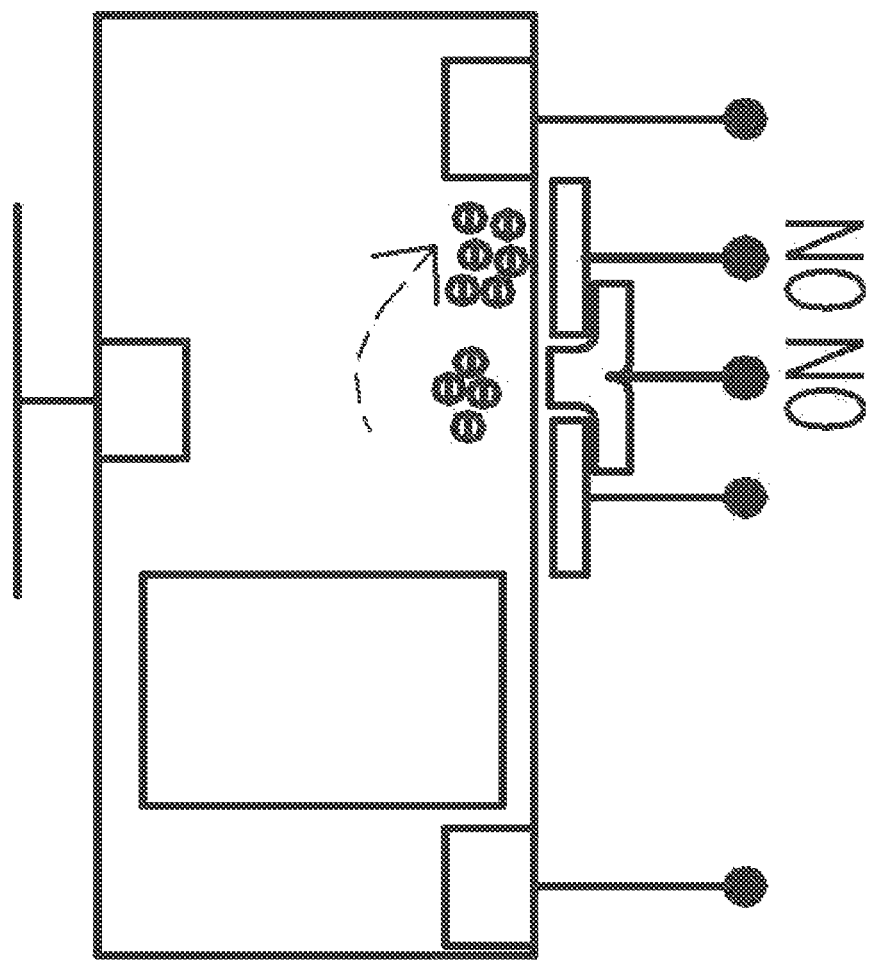

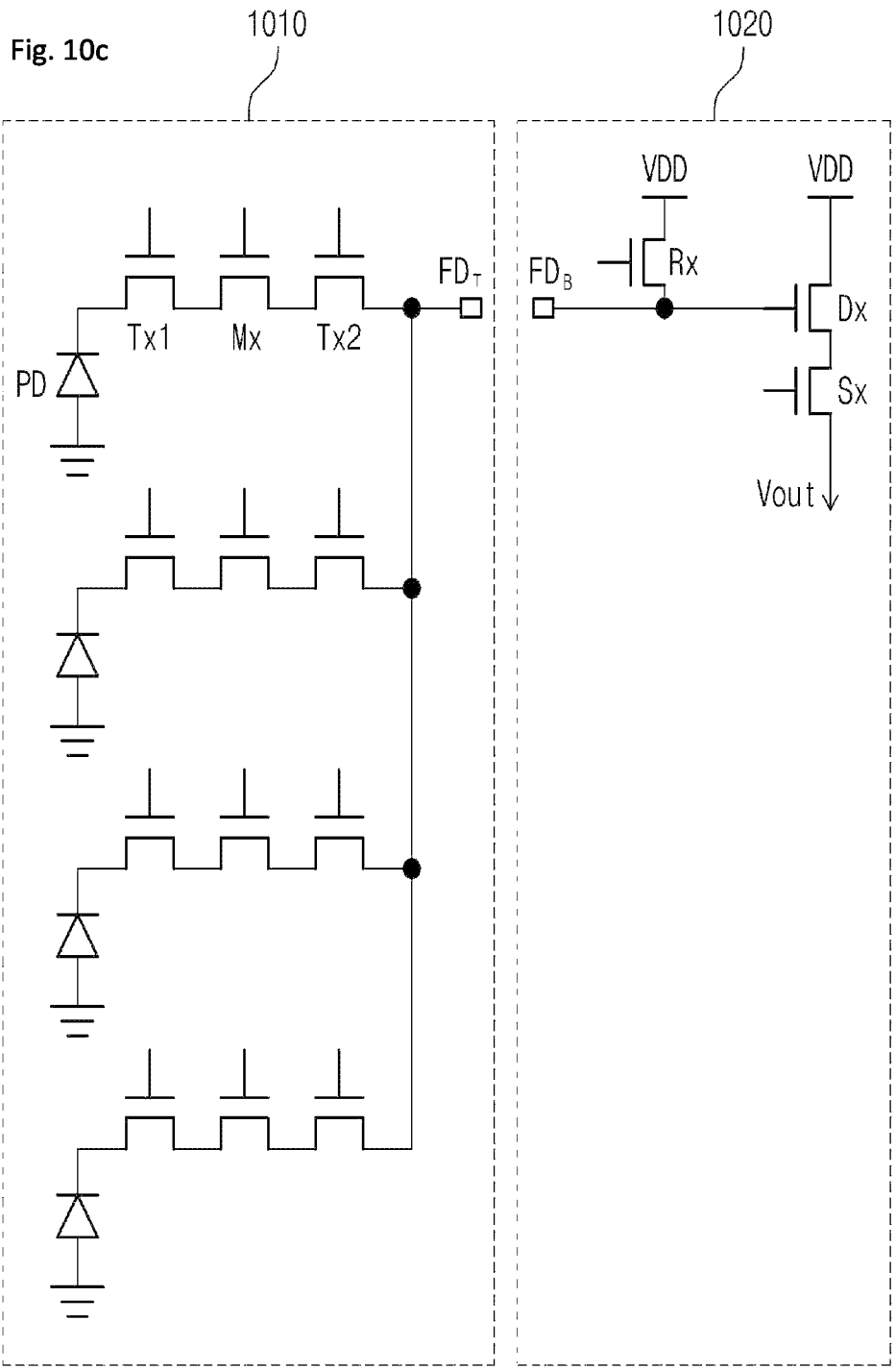

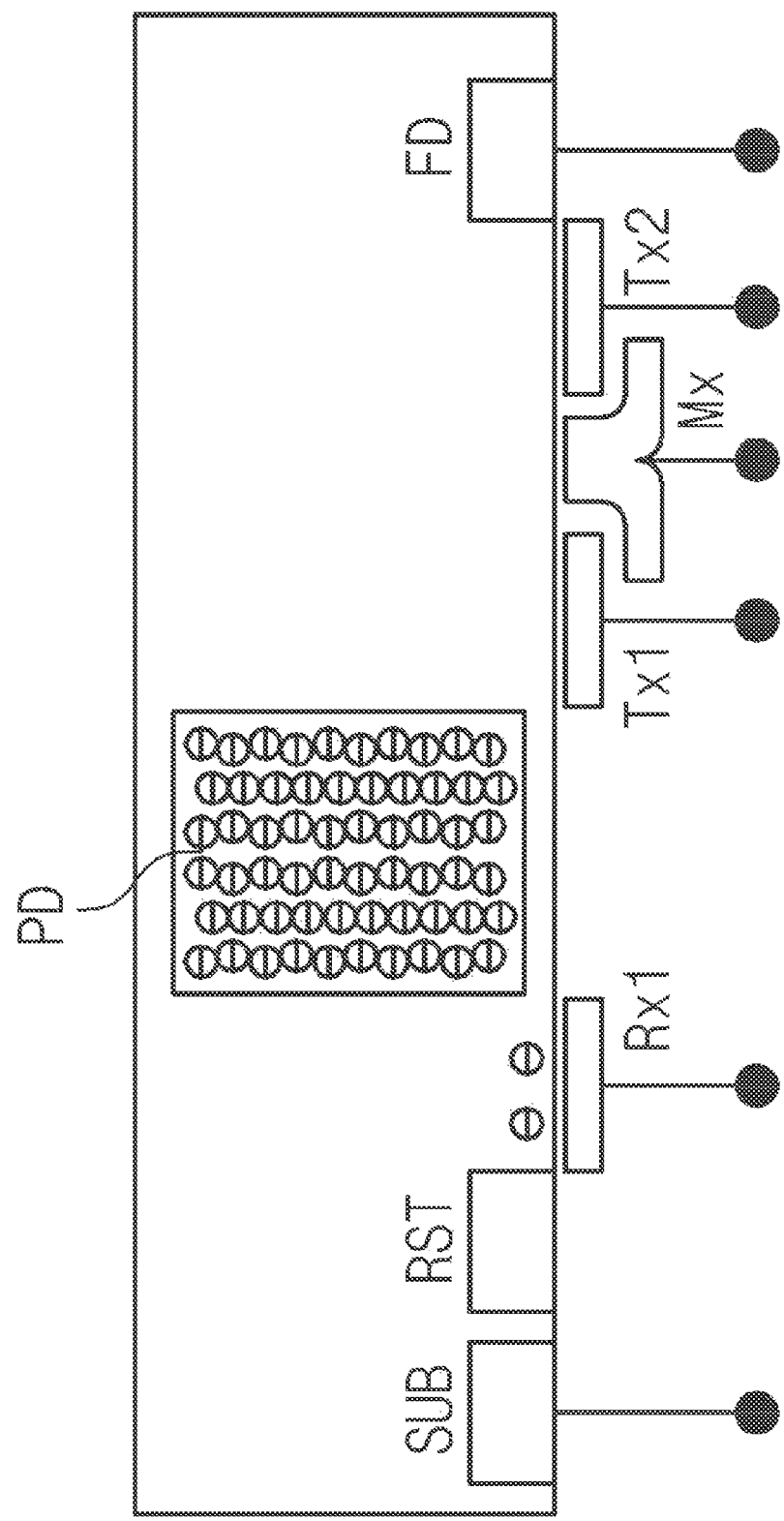

PIXEL CIRCUIT FOR GLOBAL SHUTTER OF SUBSTRATE STACKED IMAGE SENSOR

BACKGROUND OF THE INVENTION

1. Field of the Invention

The present invention relates to a pixel circuit for a global shutter of a substrate stacked image sensor, and more particularly, to a pixel circuit for a global shutter of a substrate stacked image sensor which does not include a reset transistor of a photodiode, prevents noise caused by a gap between transistors, and has a substrate-stacked 3D structure.

2. Description of the Related Art

In general, a pixel circuit of an image sensor, to which a CMOS image sensor (CIS) is applied, performs a rolling shutter operation and a global shutter operation. In the case of the rolling shutter operation, signals which are photoelectrically converted by photodiodes of each row within one frame are transmitted to floating diffusion nodes by one row which is sequentially selected, and an image signal of a corresponding pixel is outputted. In the case of the global shutter operation, the entire signals which are photoelectrically converted by all photodiodes within one frame are transmitted to floating diffusion nodes at a time, and an image signal of a corresponding pixel is outputted from a row which is sequentially selected.

Recently, as a method for improving the integration degree of an image sensor, a substrate-stacked image sensor has been developed, in which two semiconductor chips and a corresponding pad (node) are stacked to be electrically coupled to each other.

FIG. 1 illustrates a cross-sectional structure of a substrate which includes a photodiode and transistors of a pixel circuit for a global shutter of a conventional substrate-stacked image sensor. Specifically, the substrate includes a photodiode PD, a reset transistor Rx, a first transfer transistor Tx1, a memory transistor Mx, and a second transfer transistor Tx2.

Electric charges generated through a light sensing operation of the photodiode PD are outputted to a floating diffusion node FD through the first transfer transistor Tx1, the memory transistor Mx, and the second transfer transistor Tx2.

FIG. 2 illustrates that electric charges (or electrons) are transferred through the first transfer transistor Tx1, the memory transistor Mx, and the second transfer transistor Tx2.

Referring to FIGS. 1 and 2, a gap (noise occurrence region) exists between the first transfer transistor Tx1 and the memory transistor Mx and between the memory transistor Mx and the second transfer transistor Tx2. As illustrated in FIG. 2, a flow of electric charges cannot be controlled at the gap. Thus, the transfer efficiency of the electric charges is degraded. Furthermore, noise may occur at the gap.

In a reset mode, the reset transistor Rx is turned on, and the photodiode PD is coupled to a power supply terminal VDD through the reset transistor Rx and reset to the voltage level of the power supply terminal VDD.

As such, the global shutter device using the conventional substrate-stacked image sensor uses a separate reset transistor to reset the photodiode. Thus, since the reset transistor occupies a space, there are difficulties in implementing a pixel having a smaller size.

Furthermore, a flow of electric charges cannot be controlled at the gaps between the first transfer transistor, the memory transistor and between the memory transistor and the second transfer transistor. Thus, the transfer efficiency of electric charges may be degraded, and noise may occur at the gaps.

SUMMARY OF THE INVENTION

Accordingly, the present invention has been made in an effort to solve the problems occurring in the related art, and an object of the present invention is to omit a reset transistor of a photodiode, when a global shutter of a substrate-stacked image sensor is implemented.

Another object of the present invention is to substantially prevent noise caused by a gap between transistors, when a global shutter of a substrate-stacked image sensor is implemented.

Another object of the present invention is to provide a structure for implementing a small-size pixel, when a global shutter of a substrate-stacked image sensor is implemented.

Another object of the present invention is to form a structure for implementing a small-size pixel and substantially prevent electric charges overflowing from a photodiode from flowing into adjacent pixels.

In order to achieve the above object, according to one aspect of the present invention, a pixel circuit for a global shutter of a substrate-stacked image sensor may include a semiconductor chip including: a photodiode configured to output electric charges generated through a light sensing operation; and a reset node configured to receive a reset voltage from a reset voltage node and reset the photodiode. The semiconductor chip may have a structure in which the semiconductor chip is stacked over another semiconductor chip.

According to another aspect of the present invention, a pixel circuit for a global shutter of a substrate-stacked image sensor may include one or more semiconductor chips each including: a photodiode configured to output electric charges generated through a light sensing operation; a first transfer transistor; a memory transistor; and a second transfer transistor. The semiconductor chip may have a structure in which the semiconductor chip is stacked over another semiconductor chip, and the first transfer transistor, the memory transistor, and the second transfer transistor may be formed in such a manner that no gap is formed between the first transfer transistor and the memory transistor and between the memory transistor and the second transfer transistor.

According to another aspect of the present invention, a pixel circuit for a global shutter of a substrate-stacked image sensor may include: a first semiconductor chip including: a first substrate having a photodiode configured to output electric charges generated through a light sensing operation; a reset node for resetting the photodiode; and a floating diffusion node; and a first interlayer dielectric layer having a first transfer transistor, a second transfer transistor, a memory transistor, and a metal layer; and a second semiconductor chip including: a second substrate; and a second interlayer dielectric layer having a read-out circuit and a second metal layer and configured to transfer an output voltage corresponding to light sensed through the photodiode. The first and second semiconductor chip may be stacked over each other.

According to another aspect of the present invention, a pixel circuit for a global shutter of a substrate-stacked image sensor may include: a first semiconductor chip including: a first substrate having a floating diffusion node and a photodiode configured to output electric charges generated trough a light sensing operation; a first interlayer dielectric layer having a first reset transistor, a first transfer transistor, a second transfer transistor, a memory transistor, and a first metal layer, the first reset transistor coupling the photodiode to a reset node to reset the photodiode; and a second semiconductor chip including: a second substrate; and a second interlayer dielectric layer having a read-out circuit and a second metal layer and configured to transfer an output voltage corresponding to light sensed through the photodiode. The first and second semiconductor chips may be stacked over each other.

BRIEF DESCRIPTION OF THE DRAWINGS

The above objects, and other features and advantages of the present invention will become more apparent after a reading of the following detailed description taken in conjunction with the drawings, in which:

FIG. 7 is a read-out timing diagram of electric charges sensed through the photodiode;

FIGS. 8A to 8H are diagrams for explaining processes in which the sensed electric charges are read out through the transistors in response to read-out timings;

FIGS. 10A to 10C illustrate examples of a pixel circuit for a global shutter of the substrate-stacked image sensor of FIG. 9;

FIGS. 12A to 12C illustrate the operation principle of the first reset transistor Rx1 operating as an anti-blooming transistor in the fourth embodiment of the present invention.

DETAILED DESCRIPTION OF PREFERRED EMBODIMENTS

Hereafter, exemplary embodiments of the present invention will be described in detail with reference to the accompanying drawings.

Figure 1:
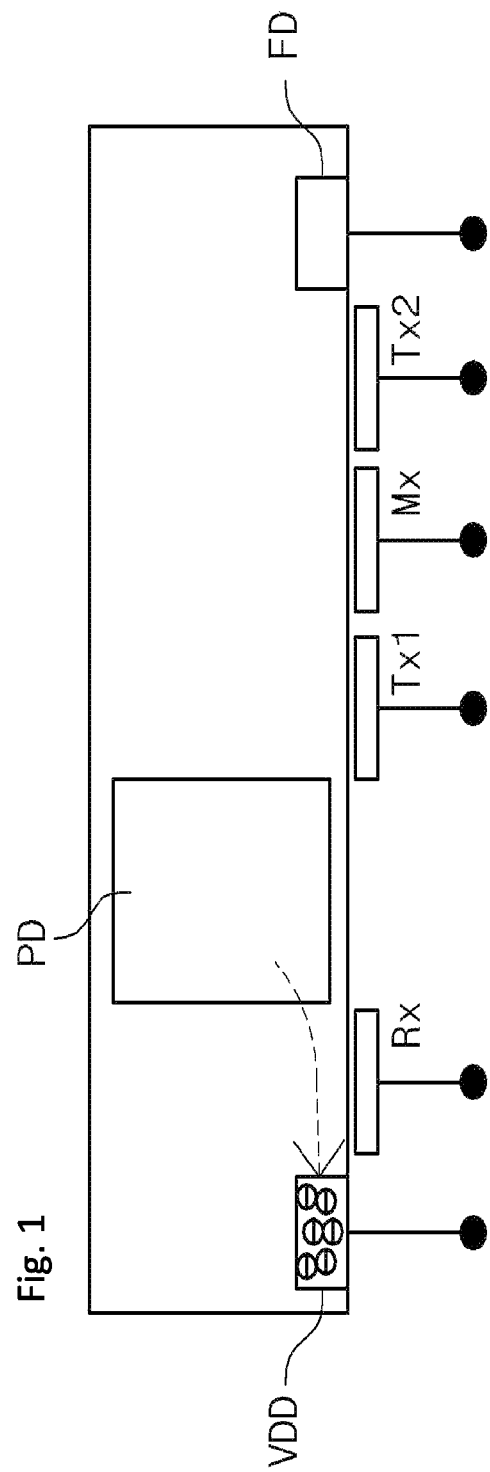
FIG. 1 is a cross-sectional view of a substrate which includes a photodiode and transistors of a pixel circuit for a global shutter of a conventional substrate-stacked image sensor.
Figure 2:
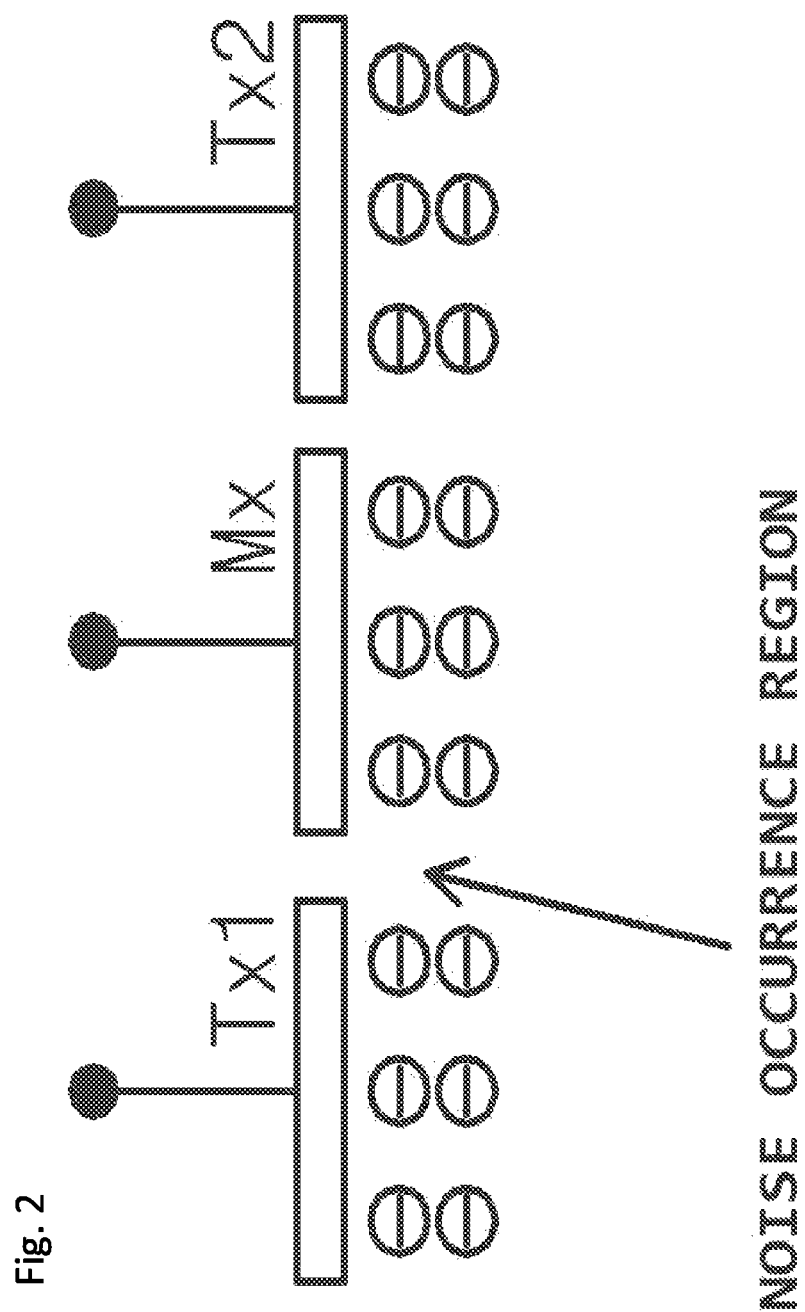
FIG. 2 is a diagram for describing that electric charges generated through an image sensing operation of the photodiode are transferred through the transistors in the conventional substrate-stacked image sensor.
Figure 3:
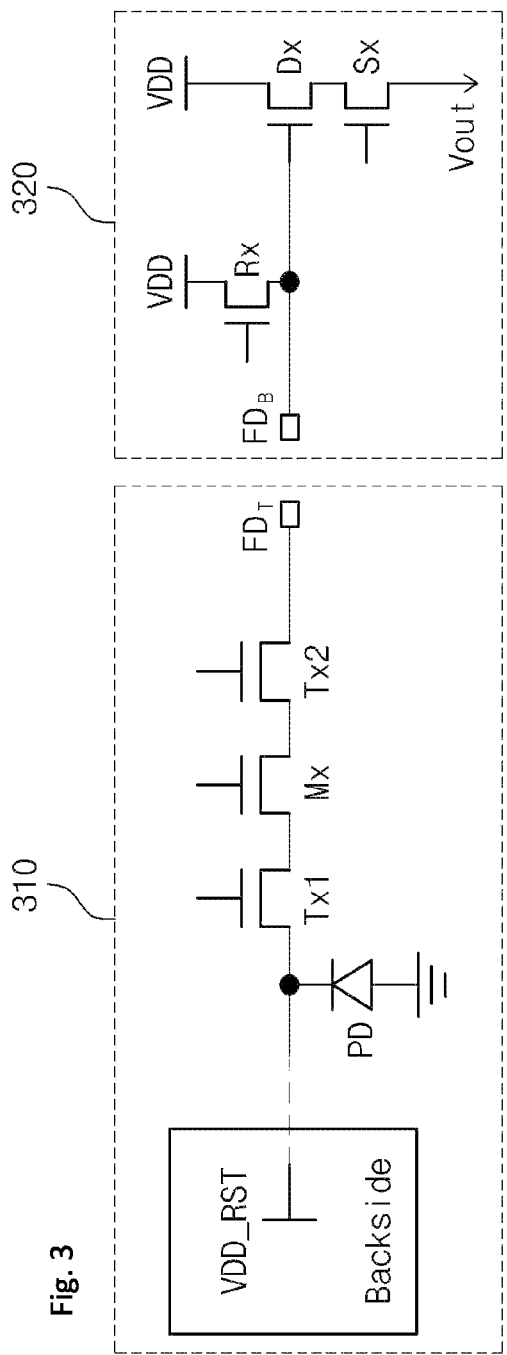
FIG. 3 is a circuit diagram of a pixel circuit for a global shutter of a substrate-stacked image sensor according to an embodiment of the present invention.

FIG. 3 is a circuit diagram of a pixel circuit for a global shutter of a substrate-stacked image sensor according to an embodiment of the present invention. The pixel circuit may include a first semiconductor circuit unit 310 and a second semiconductor circuit unit 320.

The first semiconductor circuit unit 310 may include a reset voltage node VDD_RST, a photodiode PD, a first transfer transistor Tx1, a memory transistor Mx, a second transfer transistor Tx2, and a top floating diffusion node $FD_T$. The second semiconductor circuit unit 320 may include a bottom floating diffusion node $FD_B$, a reset transistor Rx, a drive transistor Dx, and a selective transistor Sx. The reset transistor Rx, the drive transistor Dx, and the selective transistor Sx are components of a read-out circuit.

In another embodiment, the selective transistor Sx may be omitted, and the second semiconductor circuit unit 320 may include the bottom floating diffusion node $FD_B$, the reset transistor Rx, and the drive transistor Dx.

Electric charges generated through a light sensing operation of the photodiode PD may be transferred to the top floating diffusion node $FD_T$ through the first transfer transistor Tx1, the memory transistor Mx, and the second transfer transistor Tx2, which are formed on a top substrate. On a bottom substrate, the drive transistor Dx and the selective transistor Sx may be coupled in series between a power supply terminal VDD and an output terminal Vout. The electric charges transferred through the top floating diffusion $FD_T$ may be transferred to the bottom floating diffusion node $FD_B$ formed on the bottom substrate, and then transferred to the gate of the drive transistor Dx. The first transfer transistor Tx1, the memory transistor Mx, and the second transfer transistor Tx2 are basic components for a global shutter operation which exposes a screen at a time and closes the screen at a time in an image sensor.

Thus, an output voltage corresponding to light sensed through the photodiode PD may be outputted through the drive transistor Dx and the selective transistor Sx. Furthermore, the reset transistor Rx may be coupled between the power supply terminal VDD and the gate of the drive transistor Dx over the bottom substrate. The reset transistor Rx may supply a power supply voltage to the gate of the drive transistor Dx in a reset mode, and reset the bottom floating diffusion node $FD_B$ coupled to the drive transistor Dx.

Figure 4:
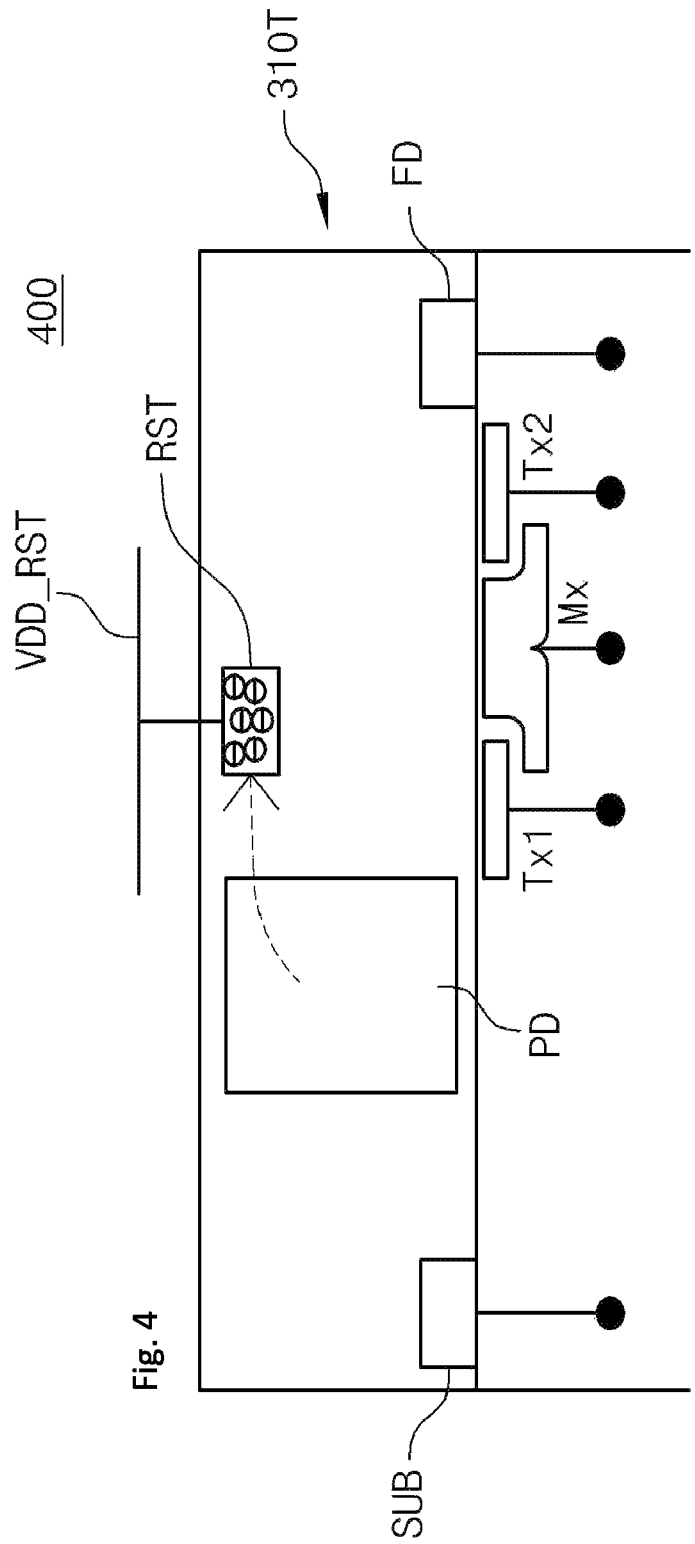
FIG. 4 illustrates a cross-sectional structure of a substrate-stacked image sensor according to first and second embodiments of the present invention.

FIG. 4 illustrates a cross-sectional structure of a substrate-stacked image sensor according to first and second embodiments of the present invention.

Referring to FIG. 4, the substrate-stacked image sensor 400 may include a first semiconductor chip 310T which includes a photodiode PD, a reset node RST, a first transfer transistor Tx1, a memory transistor Mx, a second transfer transistor Tx2, a floating diffusion node FD, and a sub node SUB for receiving power from outside.

First, the first embodiment of the present invention will be described as follows.

The photodiode PD may be coupled to a reset voltage node VDD_RST coupled to the back side through the reset node RST. Thus, when a reset voltage is supplied to the reset voltage node VDD_RST according to control of a control unit (not illustrated), the reset voltage may be supplied to the photodiode PD through the reset node RST so as to reset the photodiode PD. Therefore, a separate transistor for resetting the photodiode PD may be omitted. The position of the reset voltage node VDD_RST is not limited, but the reset voltage node VDD_RST may be installed outside the first semiconductor chip 310T. In another embodiment, the reset voltage node VDD_RST may be installed around the photodiode PD inside the first semiconductor chip 310T. For example, the reset voltage node VDD_RST may be installed on the same horizontal line as the photodiode PD.

Figure 5A:
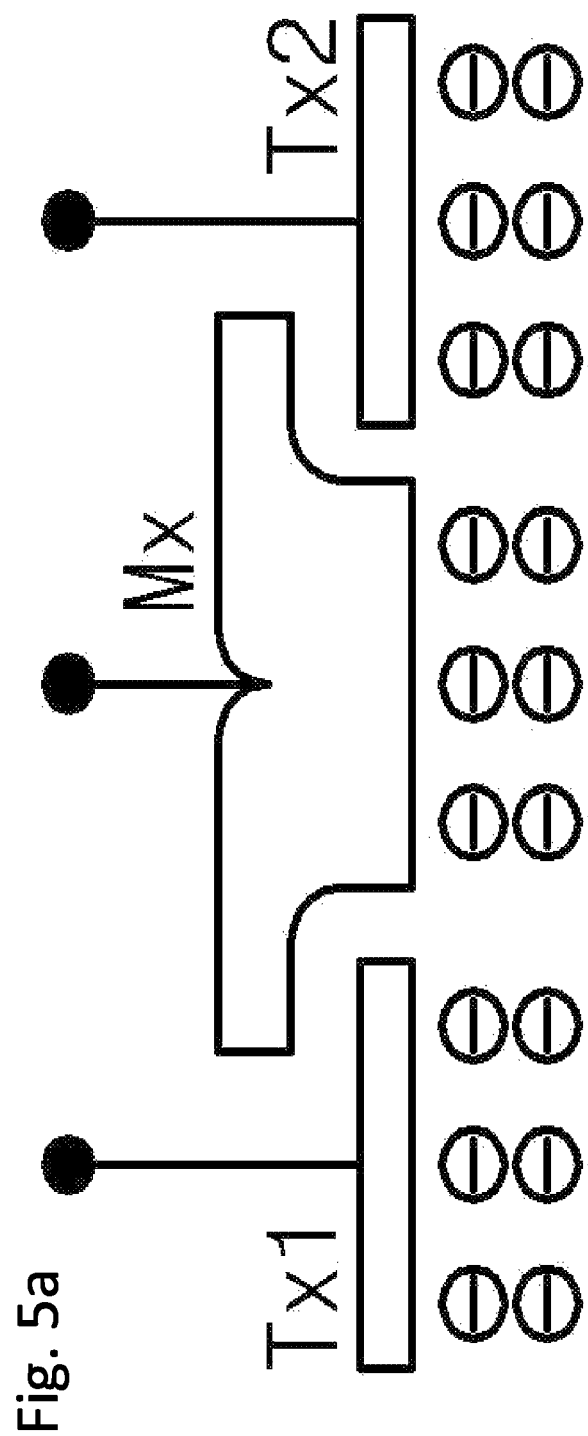
FIG. 5A is a diagram illustrating an arrangement structure in which transistors are formed in such a manner that no gap is formed.
Figure 5B:
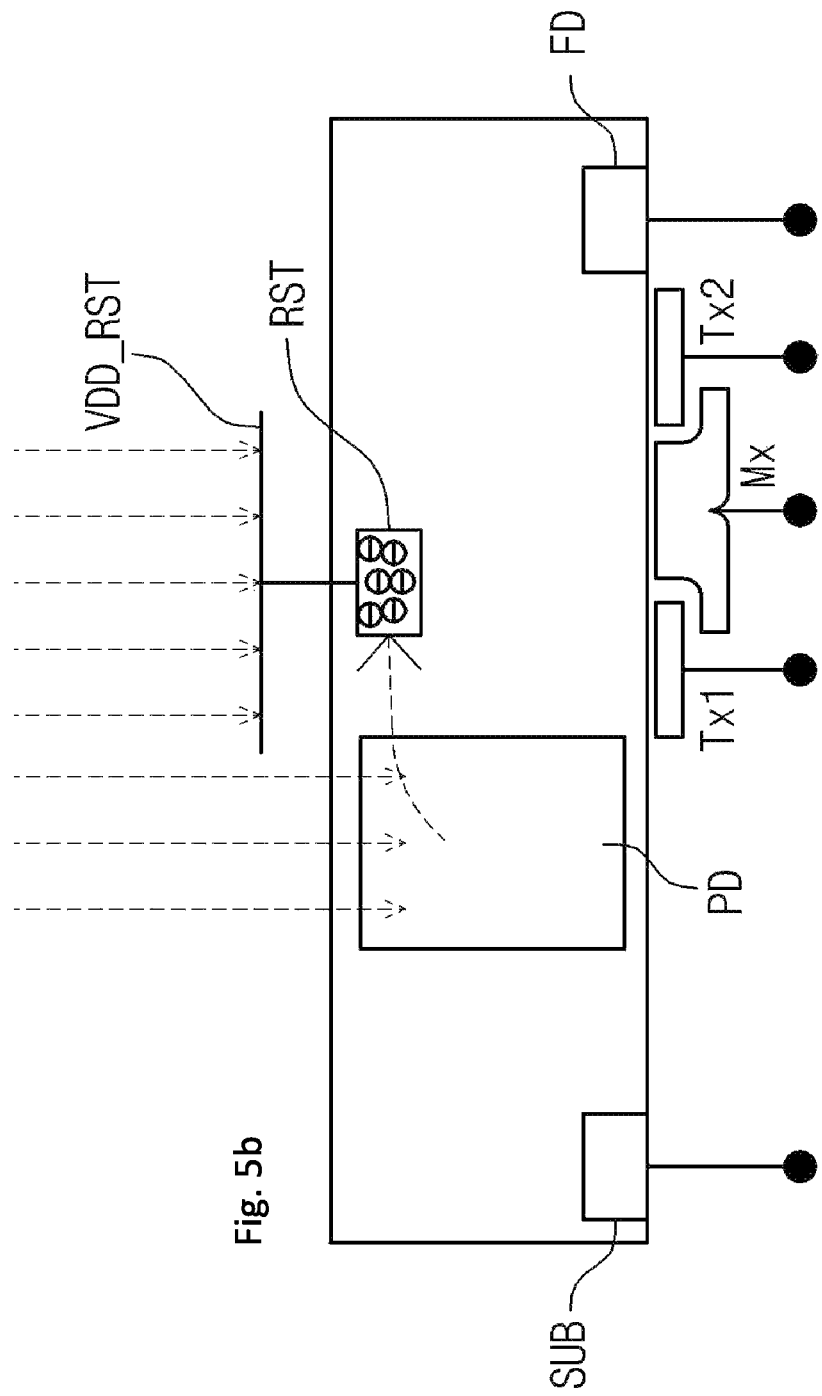
FIG. 5B is a diagram illustrating that back light to a memory transistor is blocked by a reset voltage node.

The reset voltage node VDD_RST may have a predetermined width and length, in order to block light incident on the region of the memory transistor Mx from the backside. Thus, the light incident toward the memory transistor Mx from the backside may be blocked by the reset voltage node VDD_RST, as illustrated in FIG. 5B. Thus, data which are temporarily stored in the memory transistor Mx may be prevented from being damaged by the incident light.

The first semiconductor chip 310T may be coupled to another semiconductor chip such that the semiconductor chips are stacked. The another semiconductor chip may include a read-out circuit, and the read-out circuit may include one or more of a reset transistor, a drive transistor, and a selective transistor.

The second embodiment of the present invention will be described as follows.

The memory transistor Mx may be formed between the first transfer transistor Tx1 and the second transfer transistor Tx2. As illustrated in FIGS. 4 and 5A, the memory transistor Mx may be formed to overlap the first and second transfer transistors Tx1 and Tx2. Thus, no gap is formed between the first transfer transistor and the memory transistor Mx and between the memory transistor Mx and the second transfer transistor Tx2.

Thus, when electric charges generated through a light sensing operation of the photodiode PD are transferred to the top floating diffusion node $FD_T$ through the first transfer transistor Tx1, the memory transistor Mx, and the second transfer transistor Tx2 as illustrated in FIG. 5A, the transfer of electric charges between the first and second transfer transistors Tx1 and Tx2 may be controlled through the memory transistor Mx. Thus, the occurrence of noise may be reduced.

Figure 6:
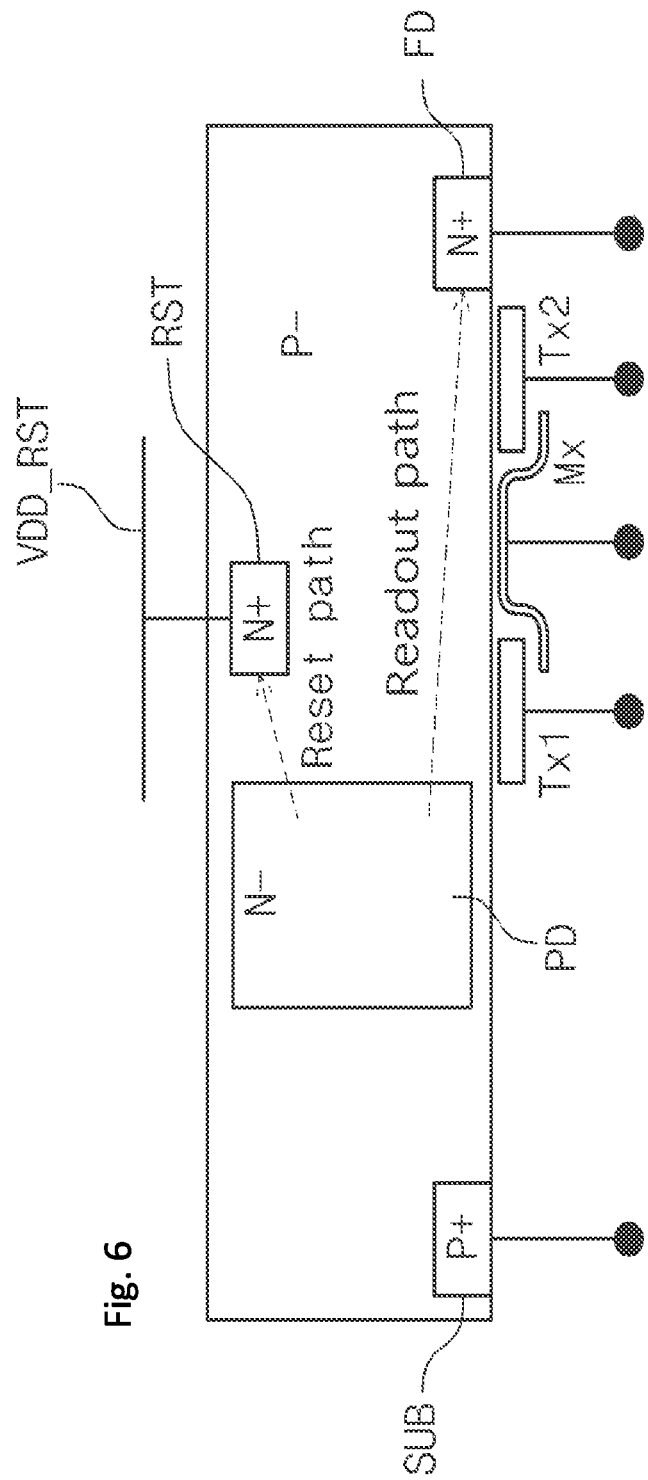
FIG. 6 is a conceptual view illustrating that a photodiode is reset and sensed electric charges are read out.

FIG. 6 conceptually illustrates that the photodiode PD is reset and image data sensed through the photodiode are read out. FIG. 7 illustrates read-out timings of electric charges (image data) sensed through the photodiode PD. FIGS. 8A to 8H are diagrams for explaining processes in which electric charges are read out through the respective transistors at the timings of FIG. 7.

The sensing operation in the pixel circuit for the global shutter of the substrate-stacked image sensor according to the embodiment of the present invention will be described with reference to FIGS. 6 to 8.

Before the photodiode PD is exposed to light, a voltage is supplied to the reset voltage node VDD_RST to reset the photodiode PD, as indicated by a section ① of FIG. 7.

Figure 8A:
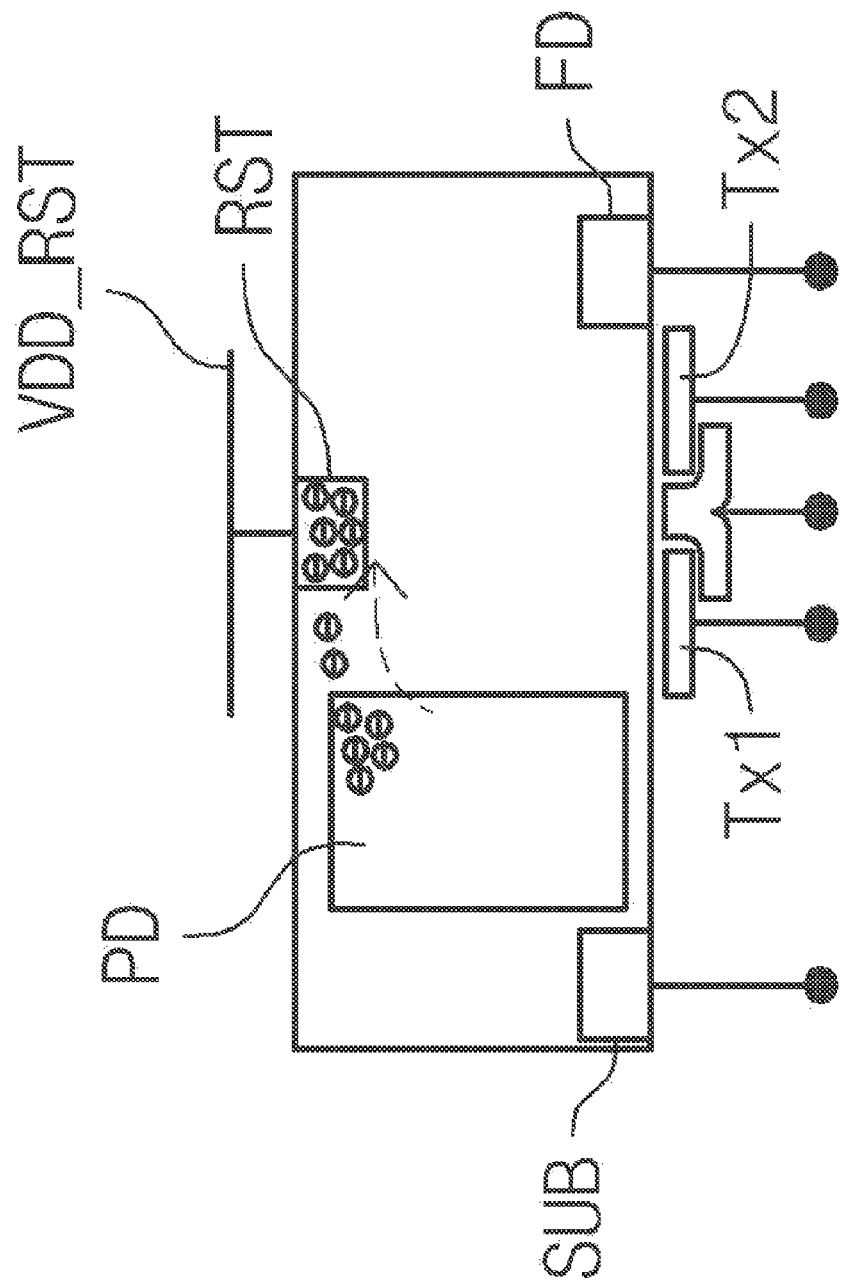
Figure 8B:
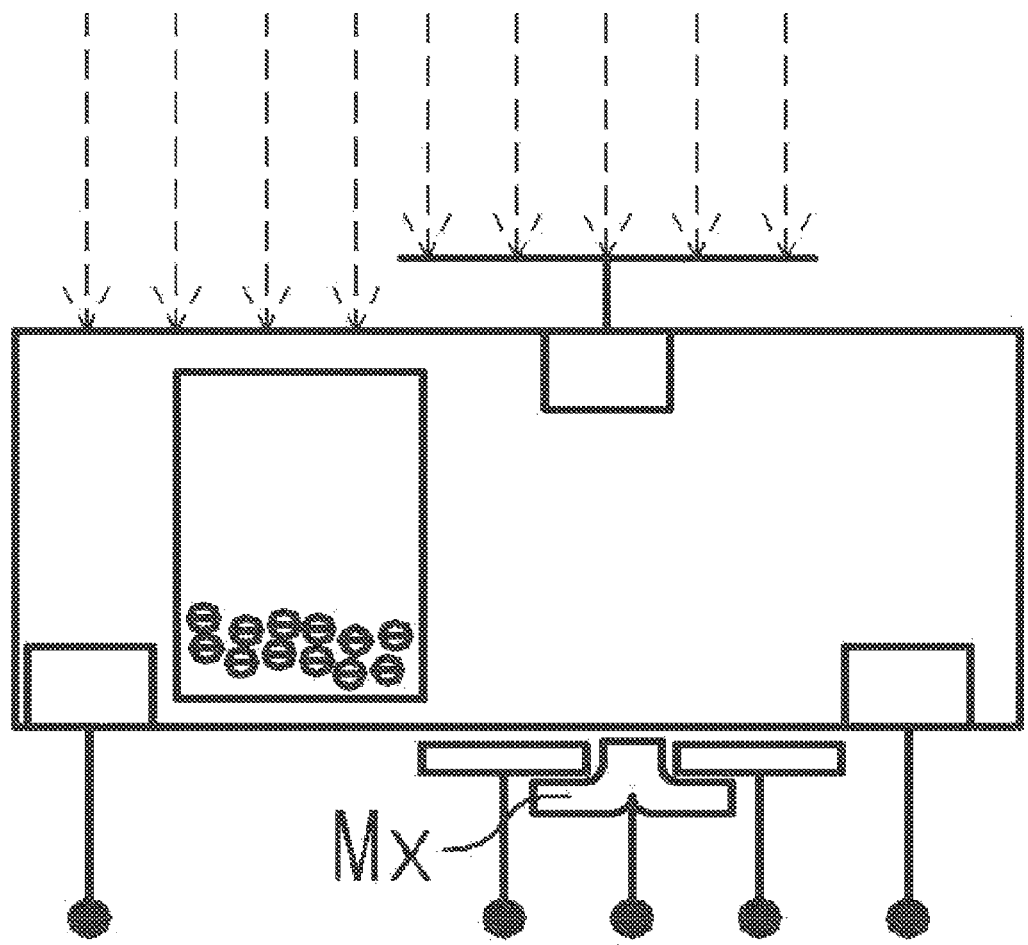

When the photodiode PD is exposed to light for an integration time as indicated by a section ② of FIG. 7, electric charges may be generated through a light sensing operation of the photodiode as illustrated in FIG. 8B.

When the first transfer transistor Tx1 is turned on as indicated by a section ③ of FIG. 7, electric charges of the photodiode PD may be moved to the first transfer transistor Tx1 as illustrated in FIG. 8C.

When the memory transistor Mx is turned on in a state where the first transfer transistor Tx1 is continuously turned on as indicated by a section ④ of FIG. 7, electric charges of the first transfer transistor Tx1 may be moved to the memory transistor Mx as illustrated in FIG. 8D.

Figure 8E:
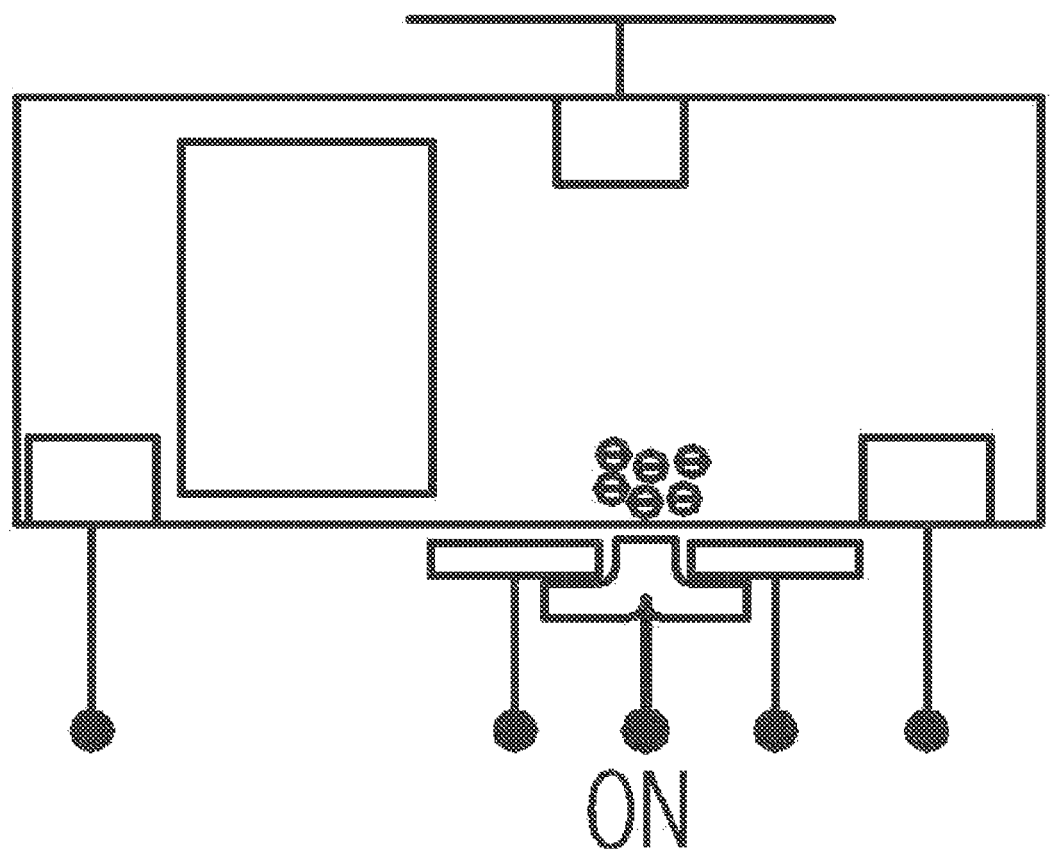

When the first transfer transistor Tx1 is turned off as indicated by a section ⑤ of FIG. 7, electric charges transferred from the first transfer transistor Tx1 are accumulated in the memory transistor Mx as illustrated in FIG. 8E. Thus, the state of the corresponding step may be maintained until read out, thereby implementing a global shutter operation.

When the second transfer transistor Tx2 is turned on as indicated by a section ⑥ of FIG. 7, the electric charges accumulated in the memory transistor Mx may be moved to the second transfer transistor Tx2 as illustrated in FIG. 8F.

Figure 8G:
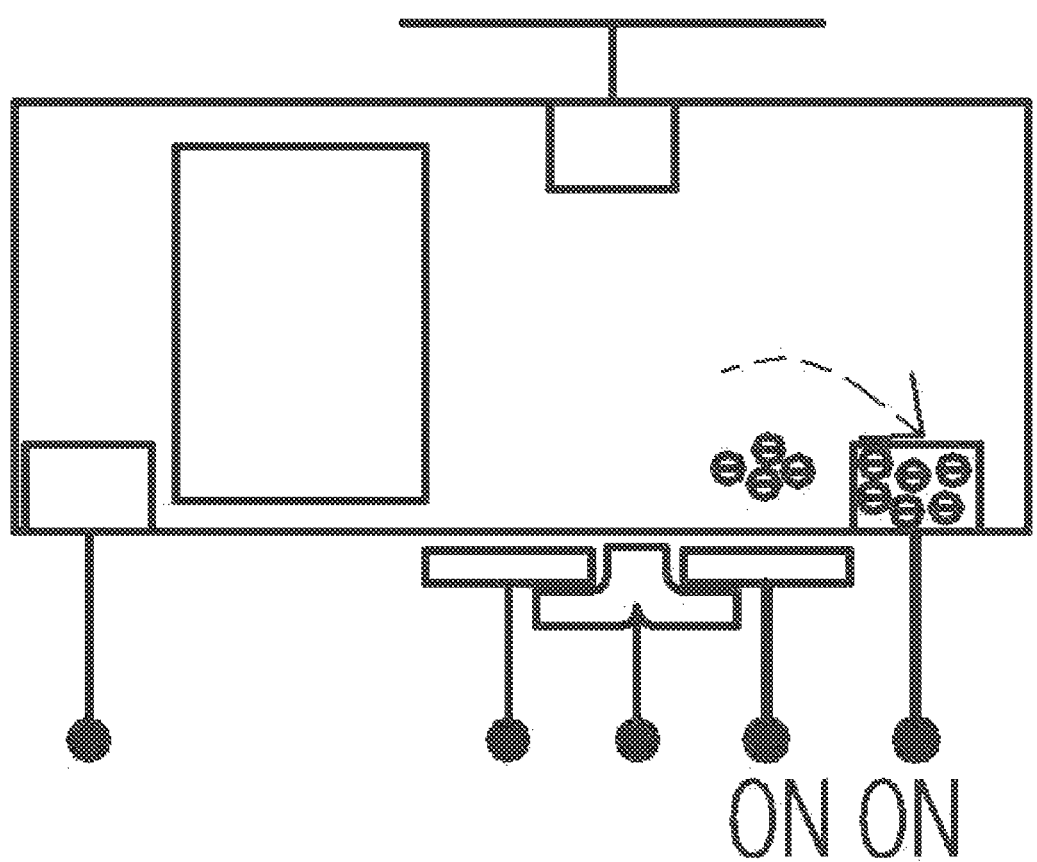

When the memory transistor Mx is turned off in a state where the second transfer transistor Tx2 is continuously turned on as indicated by a section ⑦ of FIG. 7, the electric charges may be moved to the floating diffusion node FD from the second transfer transistor Tx2 as illustrated in FIG. 8G.

Figure 8H:
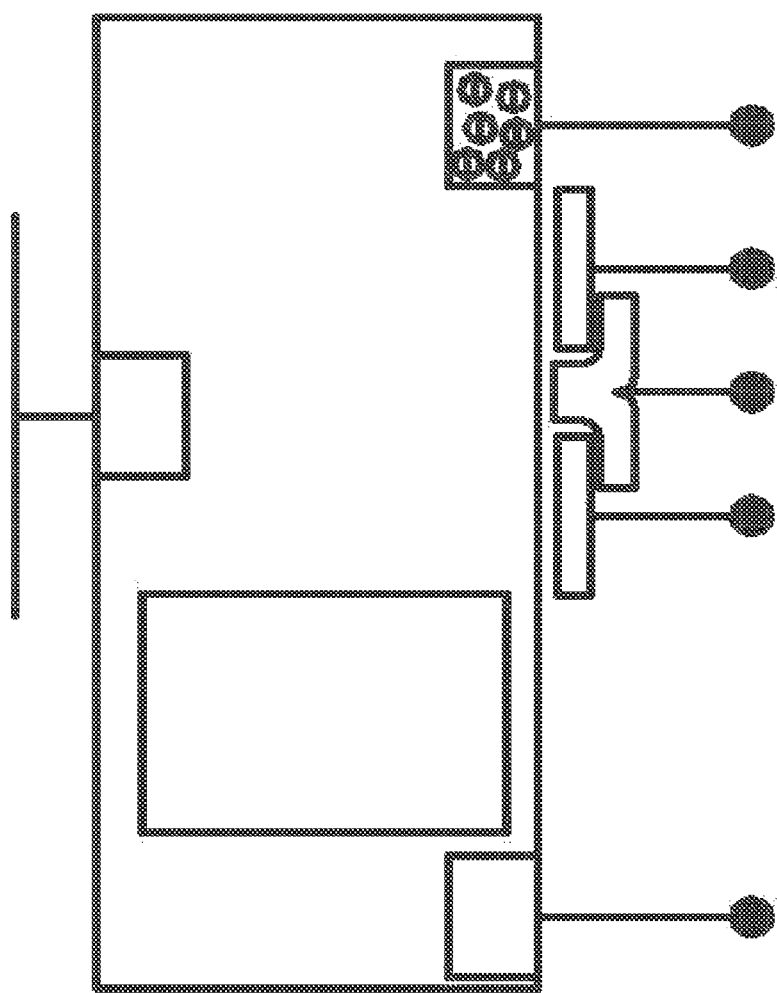

When the second transfer transistor Tx2 is turned off as indicated by a section ⑧ of FIG. 7, the electric charges may be accumulated in the floating diffusion node FD as illustrated in FIG. 8H.

For reference, in order to increase the transfer efficiency of the electric charges, the memory transistor Mx may use a higher driving voltage than the driving voltages of the first and second transistors Tx1 and Tx2. For example, the driving voltage may range from 2 to 4V.

Figure 9:
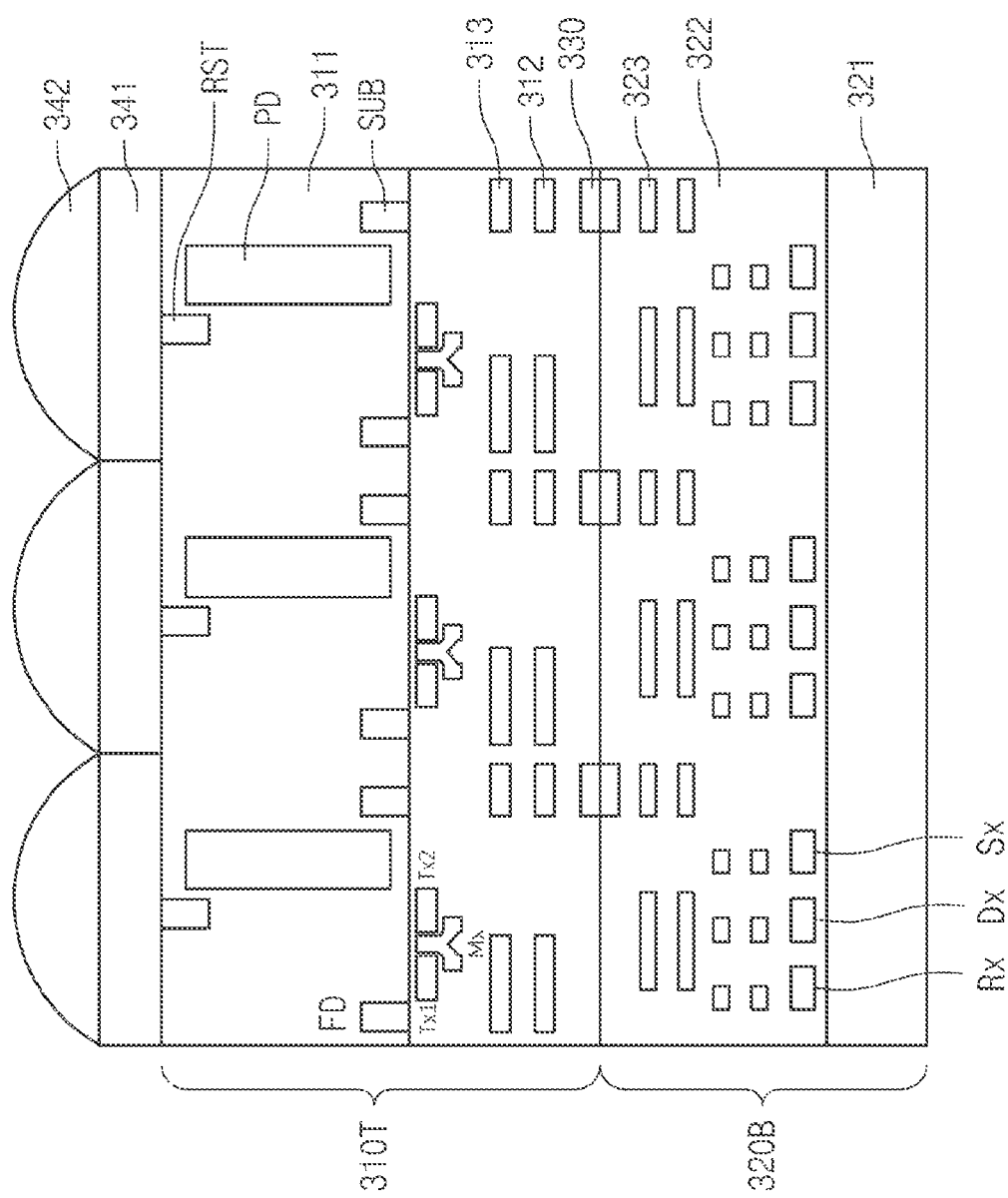
FIG. 9 is a cross-sectional diagram of a substrate-stacked image sensor according to a third embodiment of the present invention.

FIG. 9 illustrates a cross-sectional structure of a substrate-stacked image sensor according to a third embodiment of the present invention.

Referring to FIG. 9, the substrate-stacked image sensor 900 may include a first semiconductor chip 310T having a first substrate 311 and a first interlayer dielectric layer 312; a second semiconductor chip 320B having a second substrate 321 and a second interlayer dielectric layer 322; a bonding metal 330 coupling the first and second semiconductor chips 310T and 320B such that the first and second semiconductor chips 310T and 320B are stacked; and a color filter 341 and a microlens 342 which are sequentially formed on the first semiconductor chip 310T.

The first substrate 311 of the first semiconductor chip 310T may include a photodiode PD, a reset node RST, a floating diffusion node RD, and a sub node SUB, and the first interlayer dielectric layer 312 may include first and second transfer transistors Tx1 and Tx2, a memory transistor Mx, and a first metal layer 313. The first and second transfer transistors Tx1 and Tx2 and the memory transistor Mx may perform the same roles as described with reference to FIG. 3.

The second interlayer dielectric layer 322 of the second semiconductor chip 320B may include a read-out circuit and a second metal layer 323. The read-out circuit may include a reset transistor Rx and a drive transistor Dx or include a reset transistor Rx, a drive transistor Dx, and a selective transistor Sx.

Similarly, the reset transistor Rx, the drive transistor Dx, and the selective transistor Sx may perform the same roles as described with reference to FIG. 3.

In another embodiment, the selective transistor Sx may be omitted from the second interlayer dielectric layer 322, and only the reset transistor Rx, the drive transistor Dx, and the metal layer may be formed in the second interlayer dielectric layer 322.

In order to improve the electrical characteristic of the substrate-stacked image sensor 900, the bottom surface of a wafer (substrate) having passed through the corresponding processes may be polished to reduce the thickness of the wafer. The polished surface may serve as the top surface of the first semiconductor chip 310T.

The color filter 341 may not be limited to an RGB color filter, but implemented in various types. For example, the color filter 341 may include a YUV filter, a white filter, and an infrared ray (IR) filter.

Figure 10A:
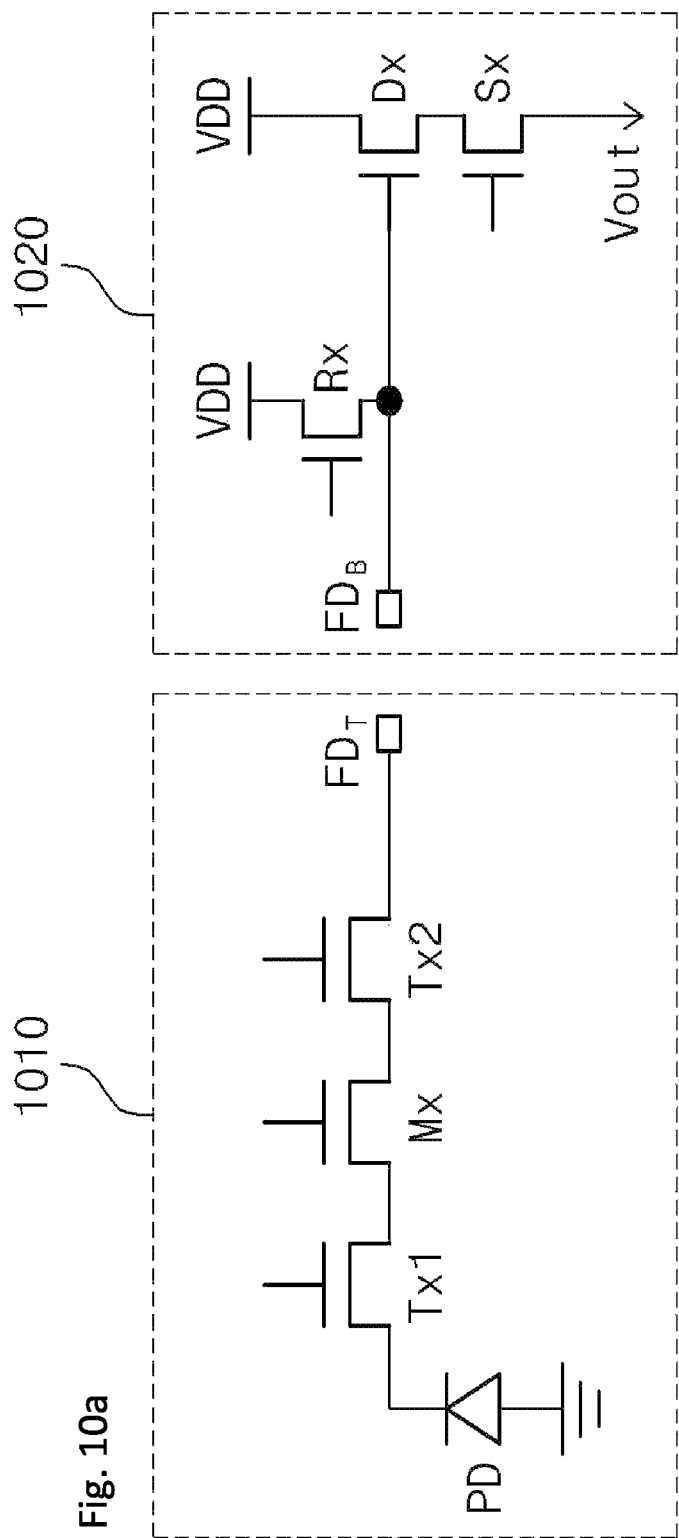
Figure 10B:
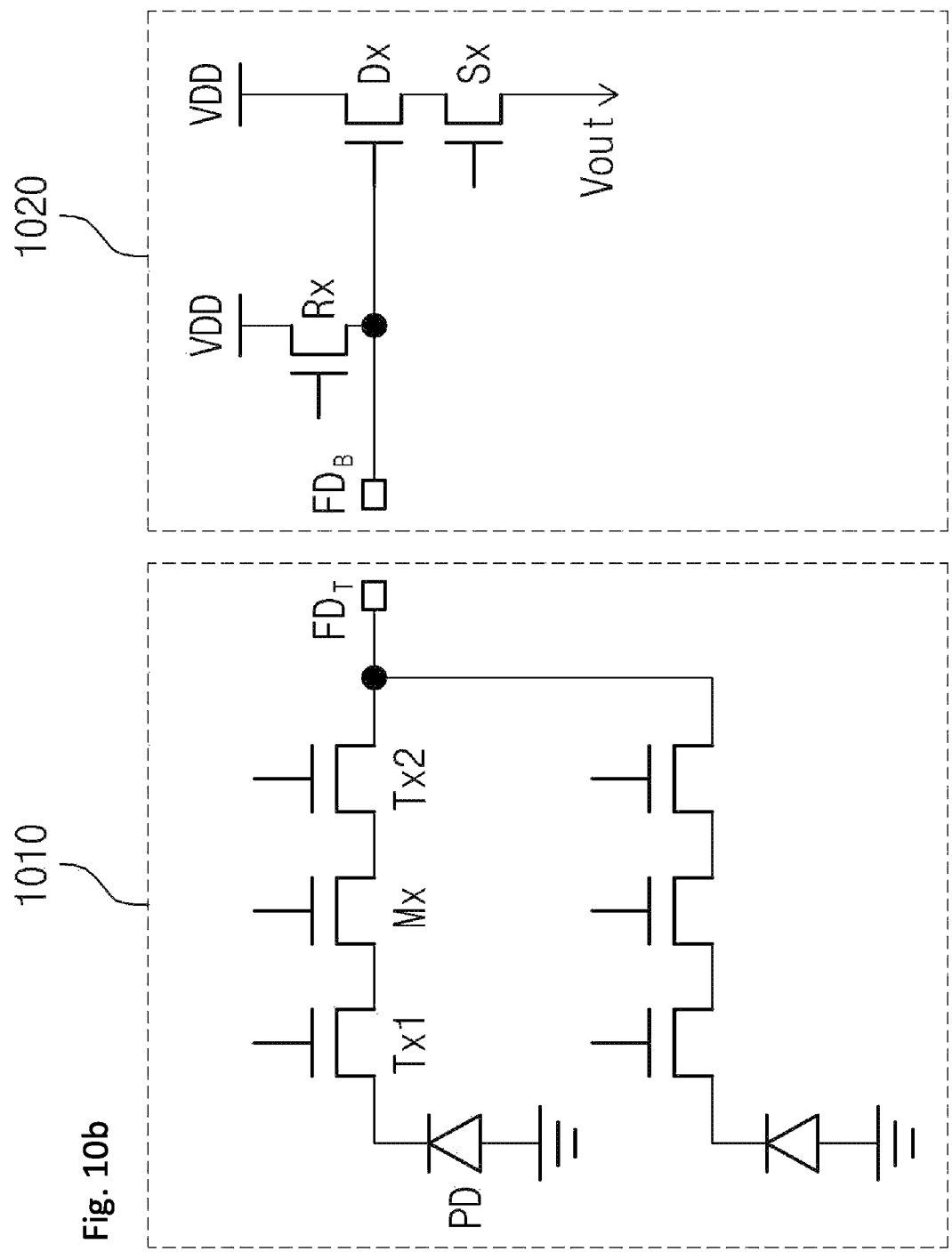

FIGS. 10A to 10C illustrate examples of a pixel circuit applied to the substrate-stacked image sensor of FIG. 9. The pixel circuit according to the embodiment of the present invention may include a first semiconductor circuit unit 1010 formed in the first semiconductor chip 310T and a second semiconductor circuit unit 1020 formed in the second semiconductor chip 320B.

FIG. 10A illustrates an example in which one light sensing circuit including the photodiode PD, the first transfer transistor Tx1, the second transfer transistor Tx2, and the memory transistor Mx is coupled to one floating diffusion node $FD_T$ as illustrated in FIG. 9. The photodiode PD may have an anode coupled to a ground terminal and a cathode coupled to the floating diffusion node $FD_T$ through the first transfer transistor Tx1, the memory transistor Mx, and the second transfer transistor Tx2.

On the other hand, FIG. 10B illustrates an example in which two light sensing circuits each including the photodiode PD, the first transfer transistor Tx1, the second transfer transistor Tx2, and the memory transistor Mx share one floating diffusion node $FD_T$.

Furthermore, FIG. 10C illustrates an example in which four light sensing circuits each including the photodiode PD, the first transfer transistor Tx1, the second transfer transistor Tx2, and the memory transistor Mx share one floating diffusion node $FD_T$.

Figure 11:
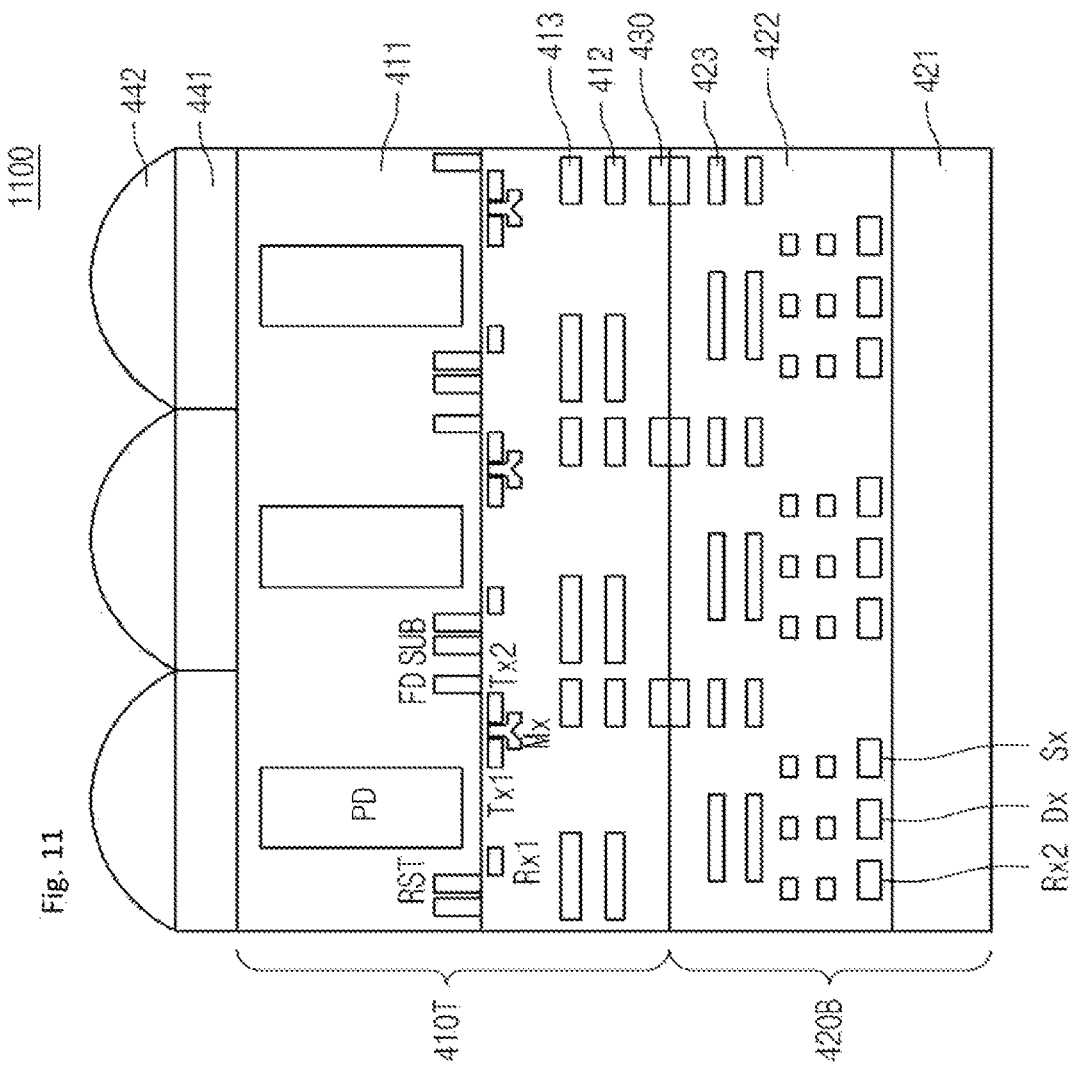
FIG. 11 is a cross-sectional structure of a substrate-stacked image sensor according to a fourth embodiment of the present invention.

FIG. 11 illustrates a cross-sectional structure of a substrate-stacked image sensor according to a fourth embodiment of the present invention.

Referring to FIG. 11, the substrate-stacked image sensor 1100 may include a first semiconductor chip 410T having a first substrate 411 and a first interlayer dielectric layer 412; a second semiconductor chip 420B having a second substrate 421 and a second interlayer dielectric layer 422; a bonding metal 430 coupling the first and second semiconductor chips 410T and 420B such that the first and second semiconductor chips 410T and 420B are stacked; and a color filter 441 and a microlens 442 which are sequentially formed on the first semiconductor chip 310T.

The first substrate 411 of the first semiconductor chip 410T may include a photodiode PD, a floating diffusion node FD, a reset node RST, and a sub node SUB, and the first interlayer dielectric layer 412 may include a first reset transistor Rx1, first and second transfer transistors Tx1 and Tx2, a memory transistor Mx, and a first metal layer 413. The first and second transfer transistors Tx1 and Tx2 and the memory transistor Mx may perform the same roles as described with reference to FIG. 3.

The second interlayer dielectric layer 422 of the second semiconductor chip 420B may include a second reset transistor Rx2, a drive transistor Dx, a selective transistor Sx, and a second metal layer 423.

Similarly, the second reset transistor Rx, the drive transistor Dx, and the selective transistor Sx may perform the same roles as described with reference to FIG. 3.

In order to improve the electrical characteristic of the substrate-stacked image sensor 1100, the bottom surface of a wafer (substrate) having passed through the corresponding processes may be polished to reduce the thickness of the wafer. The polished surface may serve as the top surface of the first semiconductor chip 410T.

The configuration of FIG. 11 is different from that of FIG. 9 in that the first reset transistor Rx1 is added to the first interlayer dielectric layer 412 of the first semiconductor chip 410T, and the photodiode PD is selectively coupled to the reset node RST through the first reset transistor Rx1 to reset the photodiode PD.

Figure 12B:
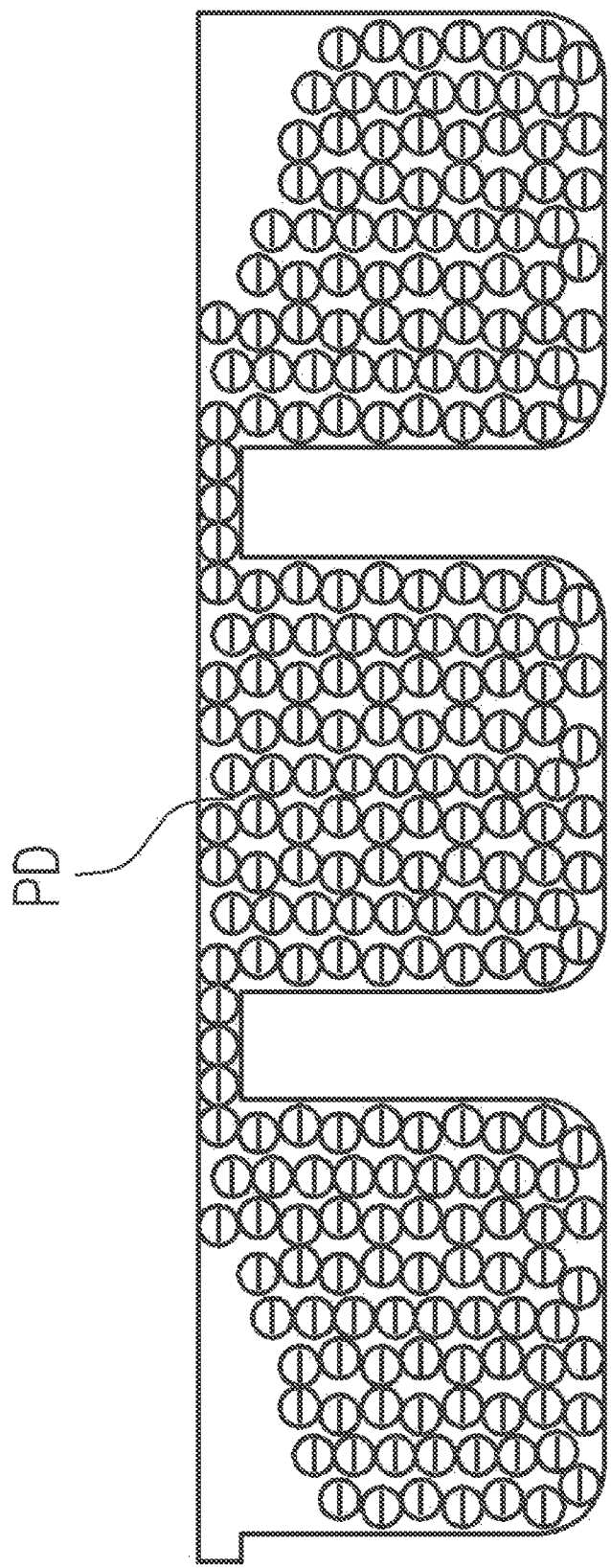
Figure 12C:
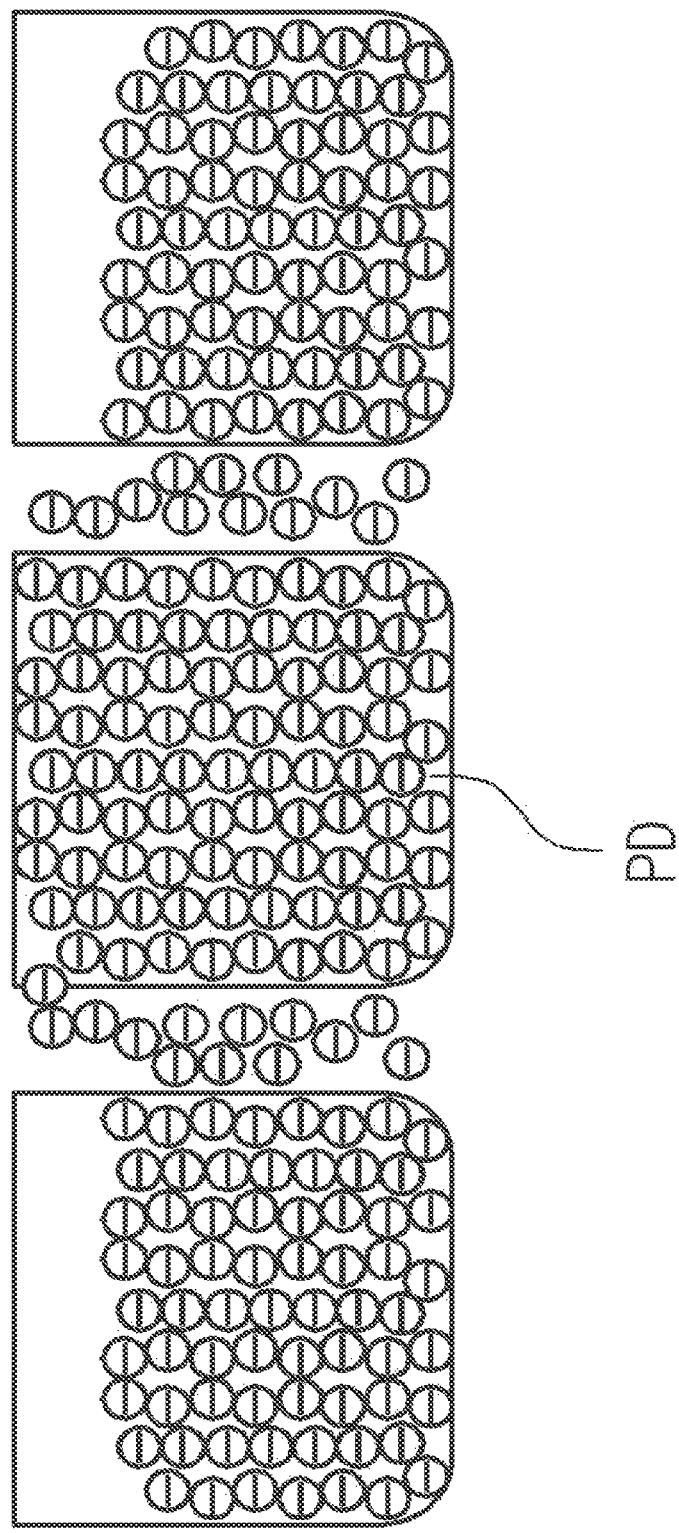

FIGS. 12A to 12C illustrate the operation principle of the first reset transistor Rx1 operating as an anti-blooming transistor.

As illustrated in FIG. 12A, electric charges generated through a light sensing operation of the photodiode PD may exceed the capacity of the photodiode PD.

In the conventional pixel circuit, electric charges overflowing from the photodiode PD may flow into adjacent pixels and serve as false signals, as illustrated in FIG. 10B.

In the embodiment of the present invention, however, the photodiode PD may be selectively coupled to the reset node RST through the first reset transistor Rx1 to reset the photodiode PD. In this case, since the first reset transistor Rx1 operates as an anti-blooming path, electric charges overflowing from the photodiode PD may be prevented from flowing into adjacent pixels and serving as false signals.

Figure 13A:
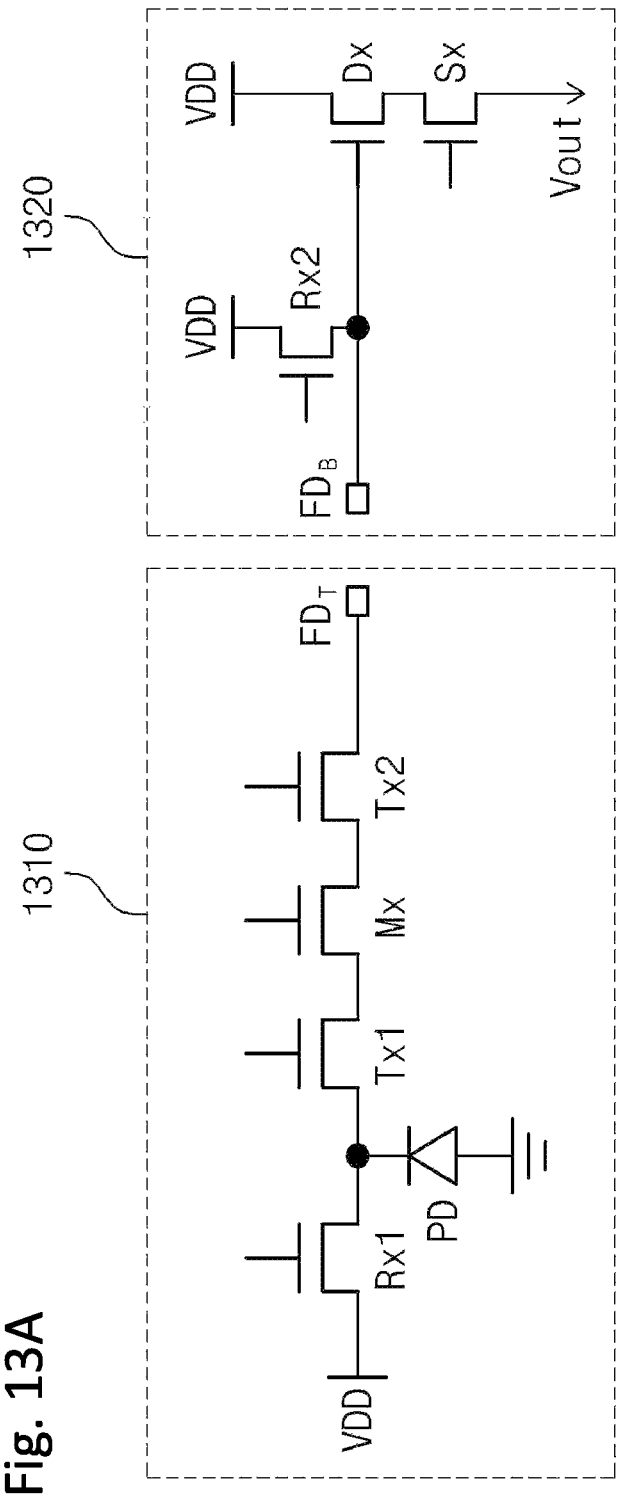
FIGS. 13A to 13C illustrate examples of a pixel circuit for a global shutter of the substrate-stacked image sensor of FIG. 11.
Figure 13B:
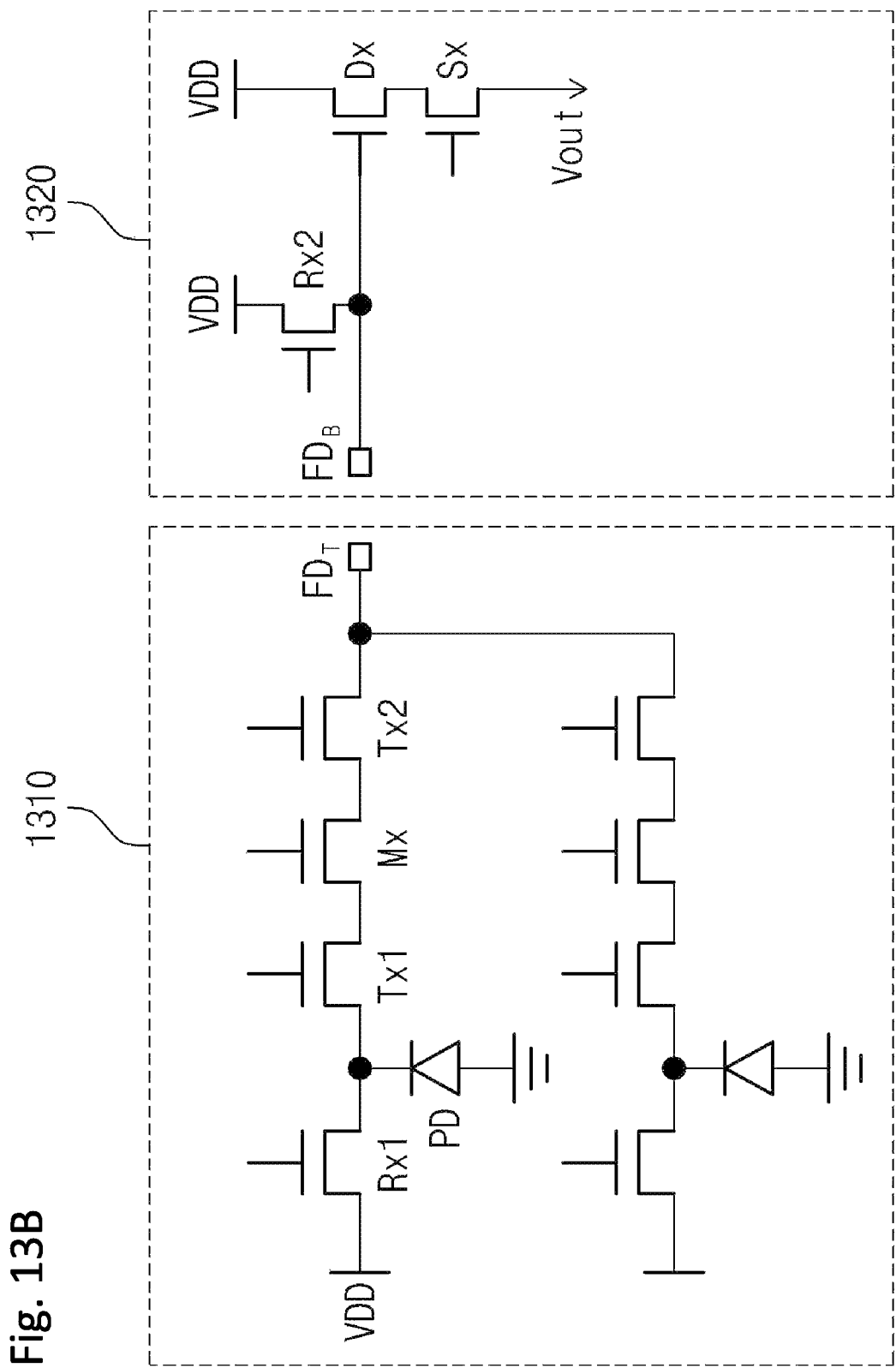
Figure 13C:
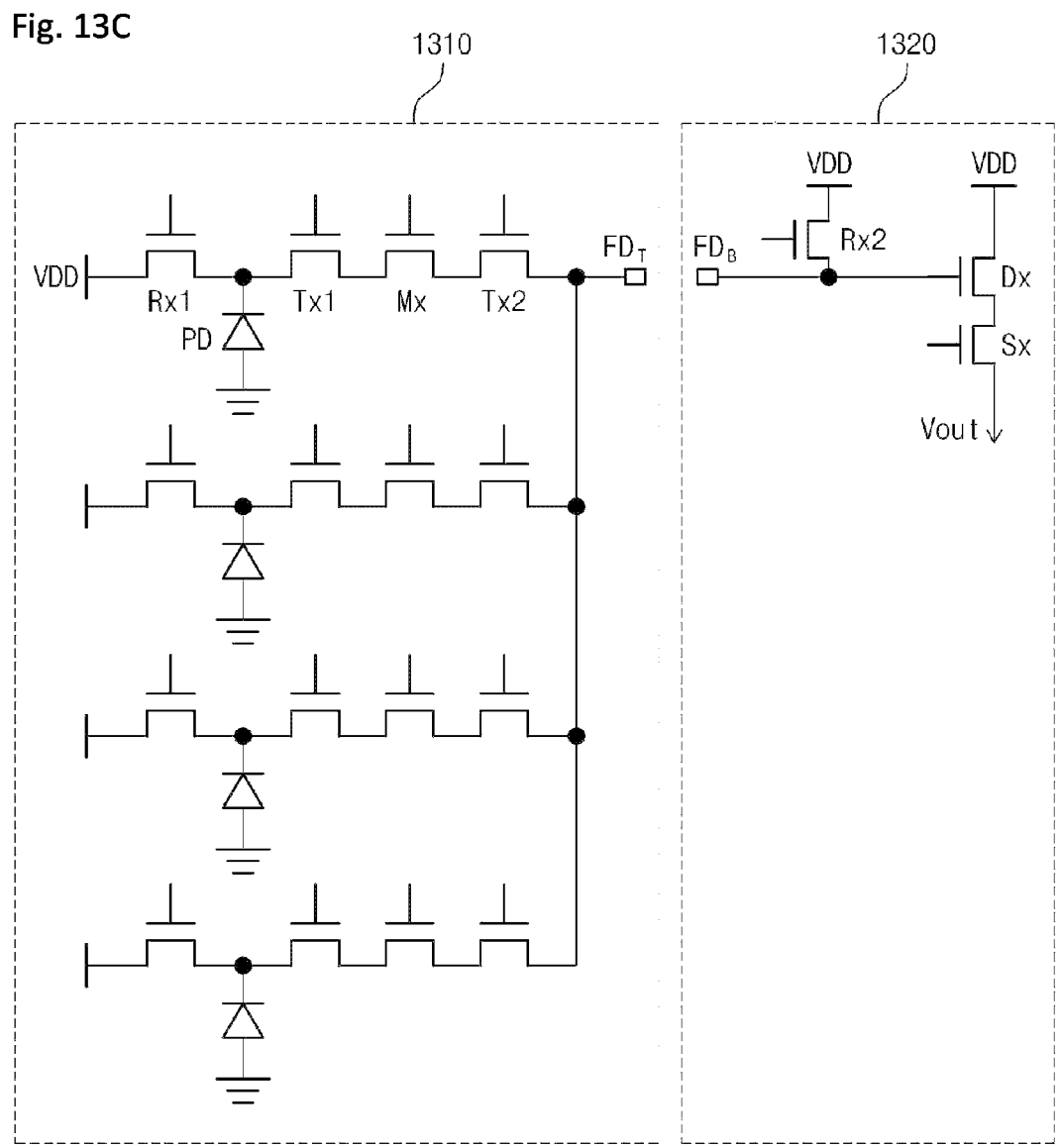

FIGS. 13A to 13C illustrate examples of the pixel circuit applied to the substrate-stacked image sensor of FIG. 11. The pixel circuit according to the embodiment of the present invention may include a first semiconductor circuit unit 1310 formed in the first semiconductor chip 410T and a second semiconductor circuit unit 1320 formed in the second semiconductor chip 420B.

FIG. 13A illustrates an example in which one light sensing circuit including the photodiode PD, the first reset transistor Rx1, the first transfer transistor Tx1, the second transfer transistor Tx2, and the memory transistor Mx is coupled to one floating diffusion node $FD_T$, as illustrated in FIG. 9.

The photodiode PD may have an anode coupled to a ground terminal and a cathode of which one side is coupled to a power supply terminal VDD through the first reset transistor Rx1 and the other side is coupled to the floating diffusion node $FD_T$ through the first transfer transistor Tx1, the memory transistor Mx, and the second transfer transistor Tx2.

On the other hand, FIG. 13B illustrates an example in which two light sensing circuits each including the photodiode PD, the first reset transistor Rx1, the first transfer transistor Tx1, the second transfer transistor Tx2, and the memory transistor Mx share one floating diffusion node $FD_T$.

Furthermore, FIG. 13C illustrates an example in which four light sensing circuits each including the photodiode PD, the first reset transistor Rx1, the first transfer transistor Tx1, the second transfer transistor Tx2, and the memory transistor Mx share one floating diffusion node $FD_T$.

According to the embodiments of the present invention, when the global shutter of the substrate-stacked image sensor is implemented, a separate transistor for resetting a photodiode may not be used, but a reset voltage node may be used to reset the photodiode. The image sensor may be reduced in size.

Furthermore, when the global shutter of the substrate-stacked image senor is implemented, the memory transistor may be used to prevent a gap from being formed between transistors. Thus, when electric charges outputted from the photodiode are transferred through the transistors, the transfer of electric charges between the transistors can be controlled to reduce noise.

Furthermore, the global shutter may be implemented with a 3D structure, thereby contributing to implementing a small-size pixel. Thus, the chip size may be minimized.

Furthermore, as the reset voltage node is used to block light incident on the memory transistor region from the back side, image data temporarily-stored in the memory transistor may be substantially prevented from being damaged.

Furthermore, when the global shutter of the substrate-stacked image sensor is implemented, the reset transistor may be used to substantially prevent electric charges overflowing from the photodiode from flowing into adjacent pixels and serving as false signals.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A pixel circuit for a global shutter of a substrate-stacked image sensor, comprising a semiconductor chip including:

a photodiode configured to output electric charges generated through a light sensing operation; and a reset node configured to receive a reset voltage from a reset voltage node and reset the photodiode, wherein the semiconductor chip has a structure in which the semiconductor chip is stacked over another semiconductor chip.

2. The pixel circuit of claim 1, wherein the reset voltage node has a structure that blocks incident light.

3. The pixel circuit of claim 1, wherein the reset voltage node is installed outside the semiconductor chip.

4. The pixel circuit of claim 1, wherein the reset voltage node is formed around the photodiode.

5. The pixel circuit of claim 1, wherein the another semiconductor chip comprises a read-out circuit.

6. The pixel circuit of claim 5, wherein the read-out circuit comprises one or more of a reset transistor, a drive transistor, and a selective transistor.

7. The pixel circuit of claim 1, wherein the photodiode, the reset node, and a floating diffusion node for transferring electric charges outputted from the photodiode are formed over a substrate of the semiconductor chip.

8. A pixel circuit for a global shutter of a substrate-stacked image sensor, comprising one or more semiconductor chips each including:

a photodiode configured to output electric charges generated through a light sensing operation;

a first transfer transistor;

a memory transistor; and a second transfer transistor, wherein the semiconductor chip has a structure in which the semiconductor chip is stacked over another semiconductor chip, and the first transfer transistor, the memory transistor, and the second transfer transistor are formed in such a manner that no gap is formed between the first transfer transistor and the memory transistor and between the memory transistor and the second transfer transistor.

9. The pixel circuit of claim 8, wherein one surface of the memory transistor is formed to overlap one surface of the first transfer transistor, and the other surface of the memory transistor is formed to overlap one surface of the second transfer transistor.

10. The pixel circuit of claim 8, wherein the another semiconductor chip further comprises a read-out circuit.

11. The pixel circuit of claim 10, wherein the read-out circuit comprises one or more of a reset transistor, a drive transistor, and a selective transistor.

12. The pixel circuit of claim 8, wherein the photodiode, the floating diffusion node, and a reset node for resetting the photodiode are formed over a substrate of the semiconductor chip.

13. The pixel circuit of claim 8, wherein the first transfer transistor, the memory transistor, and the second transfer transistor are formed in an interlayer dielectric layer of the semiconductor chip.

14. A pixel circuit for a global shutter of a substrate-stacked image sensor, comprising:

a first semiconductor chip including:

a first substrate having a photodiode configured to output electric charges generated through a light sensing operation; a reset node for resetting the photodiode; and a floating diffusion node; and a first interlayer dielectric layer having a first transfer transistor, a second transfer transistor, a memory transistor, and a metal layer; and a second semiconductor chip including:

a second substrate; and a second interlayer dielectric layer having a read-out circuit and a second metal layer and configured to transfer an output voltage corresponding to light sensed through the photodiode, wherein the first and second semiconductor chips are stacked over each other.

15. The pixel circuit of claim 14, wherein the first and second semiconductor chips are stacked and coupled through a bonding metal.

16. The pixel circuit of claim 14, wherein the read-out circuit comprises one or more of a reset transistor, a drive transistor, and a selective transistor.

17. The pixel circuit of claim 16, wherein the reset transistor resets the drive transistor to a power supply voltage.

18. The pixel circuit of claim 14, wherein the photodiode, the first transfer transistor, the second transfer transistor, and the memory transistor serve as components of a light sensing circuit, and a plurality of light sensing circuits share one floating diffusion node.

19. The pixel circuit of claim 14, further comprising a color filter formed at the structure in which the first and second semiconductor chips are stacked, wherein the color filter comprises one or more of an RGB filter, a YUV filter, a white filter, and an infrared ray (IR) filter.

* * * * *